(12) United States Patent
Fukuda et al.

(10) Patent No.: US 6,601,199 B1
(45) Date of Patent: Jul. 29, 2003

(54) MEMORY-EMBEDDED LSI

(75) Inventors: Ryo Fukuda, Yokohama (JP); Hironori Banba, Kamakura (JP); Toshimasa Namekawa, Tokyo (JP); Shinji Miyano, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/405,128

(22) Filed: Sep. 24, 1999

(30) Foreign Application Priority Data

Oct. 28, 1998 (JP) .......................... 10-307558

(51) Int. Cl.[7] ............................................. G01R 31/28
(52) U.S. Cl. ..................... 714/719; 257/909; 365/208
(58) Field of Search ................ 324/760, 763; 365/210, 230.03, 208, 200; 714/719, 733, 718, 7, 30; 333/33, 17.3; 257/202, 204, 909, 206, 390; 716/17, 8

(56) References Cited

U.S. PATENT DOCUMENTS

| | | | |
|---|---|---|---|
| 4,849,904 A | * 7/1989 | Aipperspach et al. | ......... 716/17 |
| 5,961,653 A | * 10/1999 | Kalter et al. | ................... 714/30 |
| 5,982,189 A | * 11/1999 | Motika et al. | ............... 324/760 |
| 6,066,866 A | * 5/2000 | Omori | ....................... 257/202 |

OTHER PUBLICATIONS

Isomura, S. et al (A 36 kb/2 ns RAM with 1 kG/100 ps logic gate array; IEEE; on pp.: 26–27, 278; Feb. 15–17, 1989).*
Otomo, G. et al (Special memory and embedded memory macros in MPEG environment; IEEE; on pp.: 139–142; May 1–4, 1995).*
Furumochi, K. et al (A 500 MHz 288 kb CMOS SRAM macro for on–chip cache; IEEE; on pp.: 156–157, 435; Feb. 8–10, 1996).*
Caulk, B. et al (The architecture of the LR33000: a MIPS compatible RISC processor for embedded control applications; IEEE; on pp.: 333–336; Oct. 14–16, 1991).*
IEEE Journal, "A Configurable DRAM Macro Design for 2112 Derivative Organizations to be Synthesized Using a Memory Generator", vol. 33, No. 11, Tomoaki Yabe et al., Nov. 1998.

* cited by examiner

*Primary Examiner*—Albert Decady
*Assistant Examiner*—Guy Lamarre
(74) *Attorney, Agent, or Firm*—Banner & Witcoff, Ltd.

(57) ABSTRACT

A plurality of memory macros are laid out in a semiconductor chip. Macro ID generation circuits generate macro IDs for identifying the memory macros, and have different layouts. These macro ID generation circuits are arranged outside the memory macros in the semiconductor chip, so that test control blocks in the memory macros can use the same layouts between all the memory macros to reduce the design load.

23 Claims, 20 Drawing Sheets

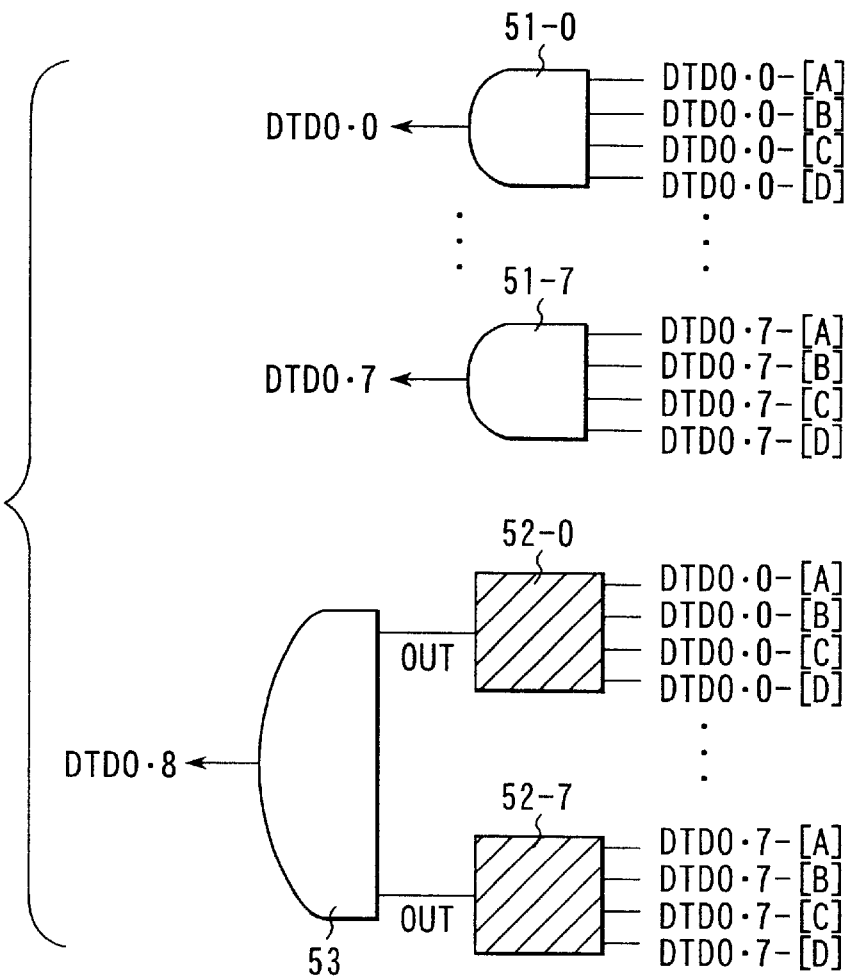
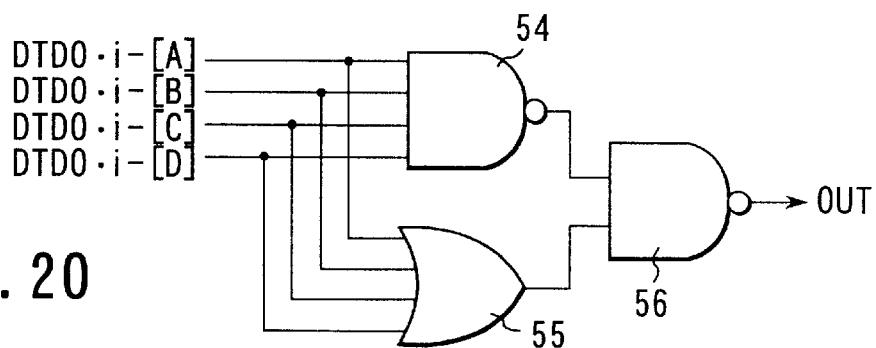
FIG. 20

MEMORY-EMBEDDED LSI

BACKGROUND OF THE INVENTION

The present invention relates to the memory macro test circuit of a memory-embedded LSI and, more particularly, to a memory-embedded LSI on which a plurality of memory macros are laid out in one chip.

In recent years, a great deal of attention is paid to a so-called memory-embedded LSI (system LSI) on which a plurality of functions including a semiconductor memory function (memory macro) are integrated on one chip to form a specific system within the chip. In the memory-embedded LSI, the semiconductor memory function and logic function, which have been formed on separate chips, are formed on one chip to contribute to high system performance, low power consumption, and downsizing (small number of components).

The memory macro contains all circuits necessary for the operation of the semiconductor memory, and can internally complete a series of operations such as a read and write. The memory macro contains an interface serving as a contact between the memory macro and logic section to directly exchange data between them.

The memory macro of the memory-embedded LSI incorporates a test control block in order to confirm the function of the memory macro. In a test, this test control block functions to test the memory macro. However, in a memory-embedded LSI having a plurality of memory macros, these memory macros are tested one by one to spend a long test time. Separately testing a plurality of memory macros requires a circuit for identifying these memory macros, so that the layout of the test control block in each memory macro changes. The test control block must be designed for every memory macro, resulting in a long memory macro design time.

BRIEF SUMMARY OF THE INVENTION

The present invention has been made to overcome the conventional drawbacks, and has as its object to provide a memory-embedded LSI capable of easily testing a memory macro within a short time and designing the memory macro within a short time in a memory-embedded LSI having a plurality of memory macros.

1) According to the present invention, a memory-embedded LSI comprises a plurality of memory macros which are laid out in one chip and have a semiconductor memory function, macro ID generation circuits arranged outside the plurality of memory macros in the one chip to generate macro IDs for identifying the plurality of memory macros, and an output selection circuit arranged outside the plurality of memory macros in the one chip to electrically connect one of the plurality of memory macros to an output pad.

The output pad outputs an output signal from each memory macro in a test.

The memory-embedded LSI according to the present invention further comprises macro selection circuits each for selecting one of the plurality of memory macros on the basis of the macro ID.

The macro selection circuits are arranged in the memory macros and have the same layout between the memory macros. The macro selection circuits may be arranged outside the plurality of memory macros together with the macro ID generation circuits.

The macro ID generation circuits generate the macro IDs using a combination of a plurality of fixed potentials.

2) According to the present invention, a memory-embedded LSI comprises a plurality of memory macros which are laid out in one chip and have a semiconductor memory function, a plurality of adders which are arranged in correspondence with the plurality of memory macros and have a function of adding input signals and generating output signals, and an output selection circuit arranged outside the plurality of memory macros in the one chip to electrically connect one of the plurality of memory macros to an output pad, wherein the plurality of adders are series-connected to each other, and input or output signals of the plurality of adders are used as macro IDs for identifying the plurality of memory macros.

The plurality of adders are arranged in corresponding memory macros and have the same layout between the memory macros.

3) According to the present invention, a memory-embedded LSI comprises a plurality of memory macros which are laid out in one chip and have a semiconductor memory function, macro selection circuits each for selecting one of the plurality of memory macros, a plurality of macro output control circuits which are arranged in correspondence with the plurality of memory macros and have a function of setting an output signal from an unselected memory macro to a fixed potential, and a logic circuit arranged outside the plurality of memory macros in the one chip to guide only an output signal from a selected memory macro to an output pad by performing logic processing for output signals from the plurality of memory macros.

The plurality of macro output control circuits are arranged in corresponding memory macros and have the same layout between the memory macros.

The logic circuit executes OR logic or AND logic of output signals from the plurality of memory macros.

4) According to the present invention, a memory-embedded LSI comprises a plurality of memory macros which are laid out in one chip and have a semiconductor memory function, macro selection circuits each having a function of selecting at least two of the plurality of memory macros, and a logic circuit arranged outside the plurality of memory macros in one chip to generate a PASS/FAIL bit representing whether the output signals from at least the two selected memory macros coincide with each other by performing logic processing for output signals from at least the two selected memory macros.

When the output signals from at least two selected memory macros coincide with each other, the logic circuit outputs the output signals from at least the two selected memory macros to an output pad.

5) According to the present invention, a memory macro outputting n-bit data comprises a circuit for reading out j (j is a natural number of not less than 2) sets of s-bit ($1 \leq s \leq n$) data to compare the s-bit data between the sets, and outputting a PASS/FAIL bit representing whether the s-bit data of the sets coincide with each other.

When the s-bit data of the sets coincide with each other, the circuit outputs the s-bit data of the sets outside the memory macro.

6) In the memory-embedded LSI according to the present invention, each memory macro in the memory-embedded LSI of 4) comprises the circuit of 5). 7) According to the present invention, a memory macro outputting n-bit data comprises a circuit for reading out s-bit ($1 \leq s \leq n$) data to compare the s-bit data with an expected value for determining whether the s-bit data is correct, and outputting a PASS/FAIL bit representing whether the s-bit data coincides with the expected value.

According to the present invention, a memory macro outputting n-bit data comprises a circuit for reading out j (j is a natural number of not less than 2) sets of s-bit ($1 \leq s \leq n$) data to compare the s-bit data between the sets and compare the s-bit data of each set with an expected value for determining whether the s-bit data is correct, and outputting a PASS/FAIL bit representing whether the s-bit data of the sets coincide with each other and whether the s-bit data of each set coincides with the expected value.

8) According to the present invention, a test method for testing a plurality of memory macros in one chip comprises the steps of simultaneously selecting the plurality of memory macros to write the same data in the memory macros, outputting a PASS/FAIL bit representing whether output signals from the memory macros coincide with each other to output, when the output signals from the memory macros coincide with each other, the output signals from the memory macros, and determining nondefectives/defectives of the plurality of memory macros on the basis of the PASS/FAIL bit and the output signals from the memory macros.

According to the present invention, a test method for testing a memory macro outputting n-bit data comprises the steps of assuming j (j is a natural number of not less than 2) blocks in units of s bits ($1 \leq s \leq n$) in the memory macro to write the same data in the blocks, outputting a PASS/FAIL bit representing whether s-bit output signals from the blocks coincide with each other to output, when the s-bit output signals from the blocks coincide with each other, the s-bit output signals from the blocks, and determining nondefectives/defectives of the memory macro on the basis of the PASS/FAIL bit and the s-bit output signals from the blocks.

According to the present invention, a test method for testing a plurality of memory macros, each outputting n-bit data comprises the steps of assuming j (j is a natural number of not less than 2) blocks in units of s bits ($1 \leq s \leq n$) in each memory macro to write the same data in the blocks, outputting a PASS/FAIL bit representing whether s-bit output signals from the blocks coincide with each other and whether output signals from the memory macros coincide with each other, when the s-bit output signals from the blocks coincide with each other and the output signals from the memory macros coincide with each other, outputting the output signals from the memory macros, and determining nondefectives/defectives of the plurality of memory macros on the basis of the PASS/FAIL bit and the output signals from the memory macros.

According to the present invention, a test method for testing a memory macro outputting n-bit data comprises the steps of reading out s-bit (($1 \leq s \leq n$) data of the memory macro, comparing the s-bit data with an expected value for determining whether the s-bit data is correct in the memory macro, generating a PASS/FAIL bit representing whether the s-bit data coincides with the expected value, and determining nondefectives/defectives of the memory macro on the basis of the PASS/FAIL bit.

According to the present invention, a test method for testing a memory macro outputting n-bit data comprises the steps of assuming j (j is a natural number of not less than 2) blocks in units of s bits ($1 \leq s \leq n$) in the memory macro to read out s-bit ($1 \leq s \leq n$) data of the blocks, comparing the s-bit data of the blocks with each other in the memory macro while comparing the s-bit data of each block with an expected value, thereby generating a PASS/FAIL bit representing whether the s-bit data of the blocks coincide with each other and whether the s-bit data of each block coincides with the expected value, and determining nondefectives/defectives of the memory macro on the basis of the PASS/FAIL bit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 19 is a circuit diagram showing an arrangement of an output synthesis circuit in FIG. 18;

FIG. 20 is a circuit diagram showing an arrangement of a comparator in FIG. 19;

DETAILED DESCRIPTION OF THE INVENTION

A memory-embedded LSI according to the present invention will be described in detail below with reference to the several views of the accompanying drawing.

Figure 1:
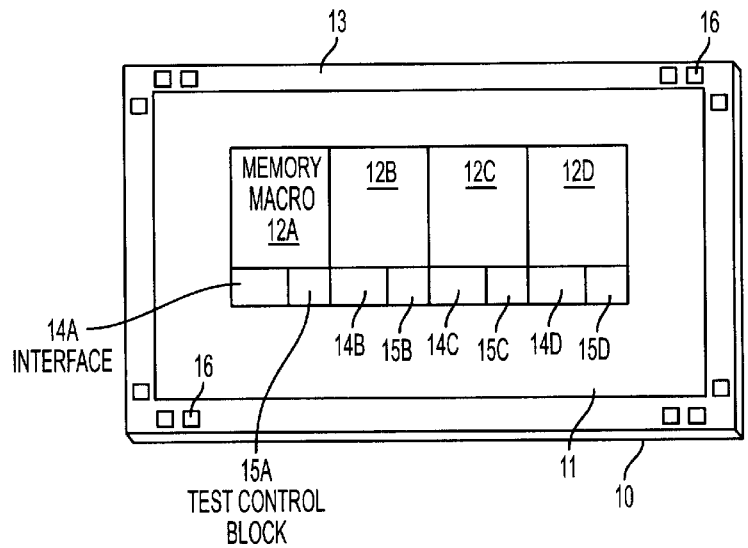
FIG. 1 is a block diagram showing an arrangement of the floor plan of a memory-embedded LSI.

FIG. 1 shows an arrangement of the floor plan of the memory-embedded LSI.

A logic section 11, memory macros 12A, 12B, 12C, and 12D, and pad section 13 are arranged on a semiconductor chip 10. The logic section 11 comprises a circuit block having a function other than a semiconductor memory function. The memory macros 12A, 12B, 12C, and 12D have, e.g., DRAM (Dynamic Random Access Memory) functions, and can internally complete a series of operations such as a data write and read.

The memory macros 12A, 12B, 12C, and 12D contain interfaces 14A, 14B, 14C, and 14D serving as contacts with the logic section 11. The interfaces 14A, 14B, 14C, and 14D comprise, e.g., input/output (I/O) registers. The memory macros 12A, 12B, 12C, and 12D incorporate test control blocks 15A, 15B, 15C, and 15D for controlling a memory macro test.

The pad section 13 is laid out along the edge of the semiconductor chip 10, and comprises pads 16 for inputting a control signal and inputting/outputting data.

As the feature of this memory-embedded LSI, data is directly exchanged between the logic section 11 and memory macro 12. That is, the logic function and semiconductor memory function are embedded in one chip to eliminate any I/O pad and any long interconnection for connecting the two functions. The memory macro does not require any large-size I/O buffer, and can contribute to low power consumption. Since the interconnection can be formed at a width of 1 μm or less on the semiconductor chip 10, the number of data simultaneously input/output to/from the memory macro can be greatly increased. Accordingly, a large amount of data can be transferred at once to contribute to high memory performance.

Figure 2:
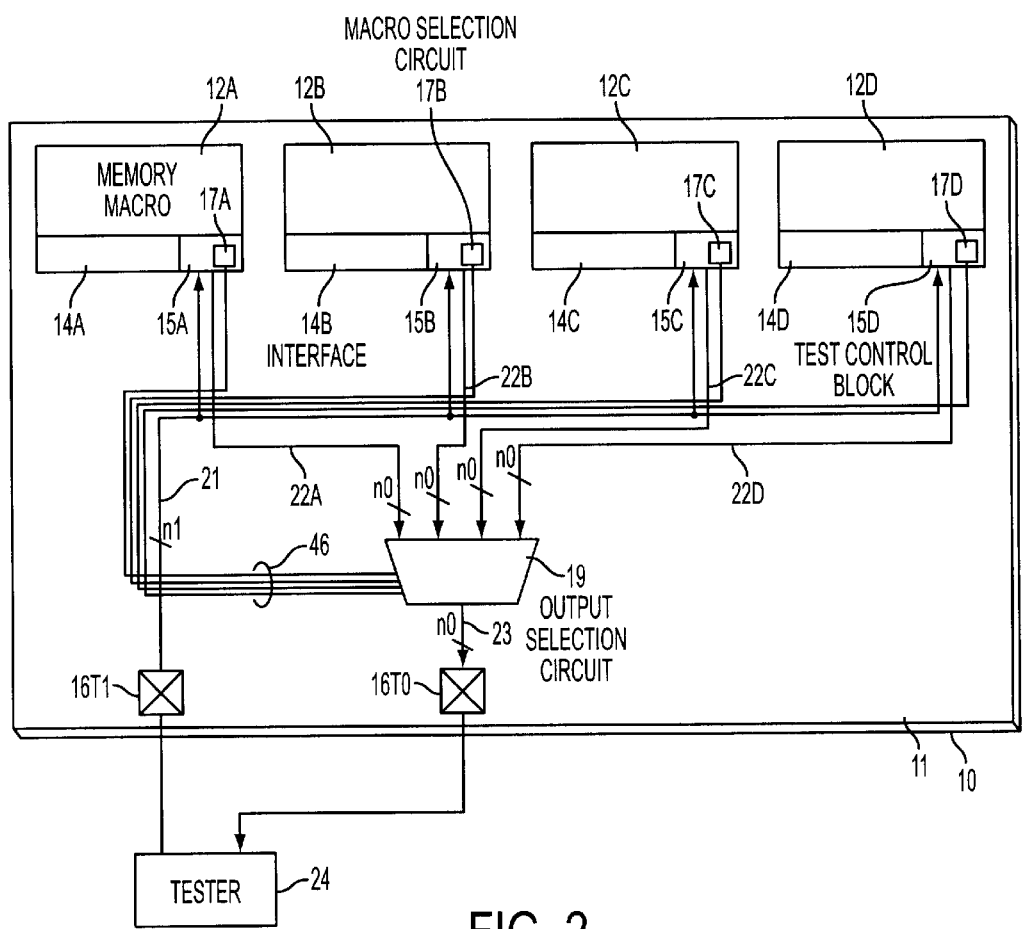
FIG. 2 is a circuit diagram showing the first embodiment of a memory macro test circuit.

FIG. 2 shows the first embodiment of the memory macro test circuit of the memory-embedded LSI in FIG. 1.

The layout of the test circuit in the first embodiment will be explained.

Four memory macros 12A, 12B, 12C, and 12D are laid out on a semiconductor chip 10. The memory macros 12A, 12B, 12C, and 12D respectively comprise interfaces 14A, 14B, 14C, and 14D for inputting/outputting data, and test control blocks 15A, 15B, 15C, and 15D for controlling a memory macro test.

The test control blocks 15A, 15B, 15C, and 15D respectively comprise macro ID generation circuits for generating macro IDs for identifying the memory macros, and macro selection circuits 17A, 17B, 17C, and 17D for comparing the macro IDs with a macro selection signal (input ID) input externally from the semiconductor chip 10 to the memory macros, and selecting a memory macro.

The macro ID generation circuits may be formed within the memory macros (test control blocks) or outside the memory macros.

Different macro IDs are assigned to the memory macros 12A, 12B, 12C, and 12D. In the first embodiment, since the four memory macros are laid out on the semiconductor chip 10, macro IDS "00", "01", "10", and "11" are respectively assigned to the memory macros 12A, 12B, 12C, and 12D.

A logic section 11 has an input signal line 21 capable of transferring, e.g., nI-bit data, first output signal lines 22A, 22B, 22C, and 22D each capable of transferring nO-bit data, second output signal line 23 capable of transferring nO-bit data, control signal lines 46, and an output selection circuit (for example, multiplexer) 19.

One end of the input signal line 21 is connected to a pad 16TI, and the other end is commonly connected to the memory macros 12A, 12B, 12C, and 12D. One end of each of the first output signal lines 22A, 22B, 22C, and 22D is connected to a corresponding one of the memory macros 12A, 12B, 12C, and 12D, and the other end is connected to an output selection circuit 19. One end of the second output signal line 23 is connected to the output selection circuit 19, and the other end is connected to a pad 16TO.

One end of each control signal line 46 is connected to a corresponding one of the memory macros 12A, 12B, 12C, and 12D, and the other end is connected to the output selection circuit 19. The output selection circuit 19 electrically connects one of the first output signal lines 22A, 22B, 22C, and 22D and the second output signal line 23 on the basis of control signals output from the memory macros 12A, 12B, 12C, and 12D to the control signal lines 46.

In general, the pads 16TI and 16TO are used to test the memory macros 12A, 12B, 12C, and 12D and to input/output data or control signal to/from the circuit of the logic section 11 under limitations on the number of pads formed on the pad section.

A test method for the memory macro in FIG. 2 will be explained.

A macro selection signal (input ID) is supplied from a tester 24 to the memory macros 12A, 12B, 12C, and 12D via the pad 16TI, and power supply voltages VDD and VSS are also supplied to them. The macro ID generation circuits in the test control blocks 15A, 15B, 15C, and 15D generate macro IDS which are compared with the input ID by the macro selection circuits 17A, 17B, 17C, and 17D.

As a result of comparison between the macro IDS and input ID, one of the four memory macros 12A, 12B, 12C, and 12D is selected. An output signal MEn from the macro selection circuit changes to "0" in the selected memory macro, and the output signal MEn changes to "1" in the remaining three unselected memory macros.

The selected memory macro, i.e., the memory macro having an output signal MEn "0" can receive a command.

Hence, test operation (data write and read) is enabled in the selected memory macro, but is not enabled in the unselected memory macros, i.e., the memory macros an output signal MEn "1".

In the selected memory macro, data is written in a memory cell, and then data is read out from a memory cell. For example, in a memory macro having 256 I/Os, 256 data are simultaneously read out. In the first embodiment, the 256 data are divisionally read out every 8 bits (nO bits) by 32 operations to the tester 24 outside the semiconductor chip 10.

At this time, the multiplexer 19 electrically connects to the second output signal line 23 one of the first output signal lines 22A, 22B, 22C, and 22D connected to the selected memory macro. The output signals MEn from the macro selection circuits 17A, 17B, 17C, and 17D in the memory macros 12A, 12B, 12C, and 12D are directly input to the multiplexer 19 via the control signal lines 46. Therefore, the multiplexer 19 can electrically connect to the second output signal line 23 one of the first output signal lines 22A, 22B, 22C, and 22D connected to the selected memory macro on the basis of the output signals MEn from the macro selection circuits 17A, 17B, 17C, and 17D in the memory macros 12A, 12B, 12C, and 12D.

Data read outside the semiconductor chip 10 is compared with an expected value by the tester 24 to determine whether a memory cell is nondefective or defective based on the comparison result.

By sequentially switching one selected memory macro, all the memory macros 12A, 12B, 12C, and 12D can undergo a function test.

The memory macro test circuit having this layout outputs data read out from the selected memory macro via the output selection circuit 19. The four memory macros 12A, 12B, 12C, and 12D can be sequentially selected to test all the memory macros.

Figure 3A:
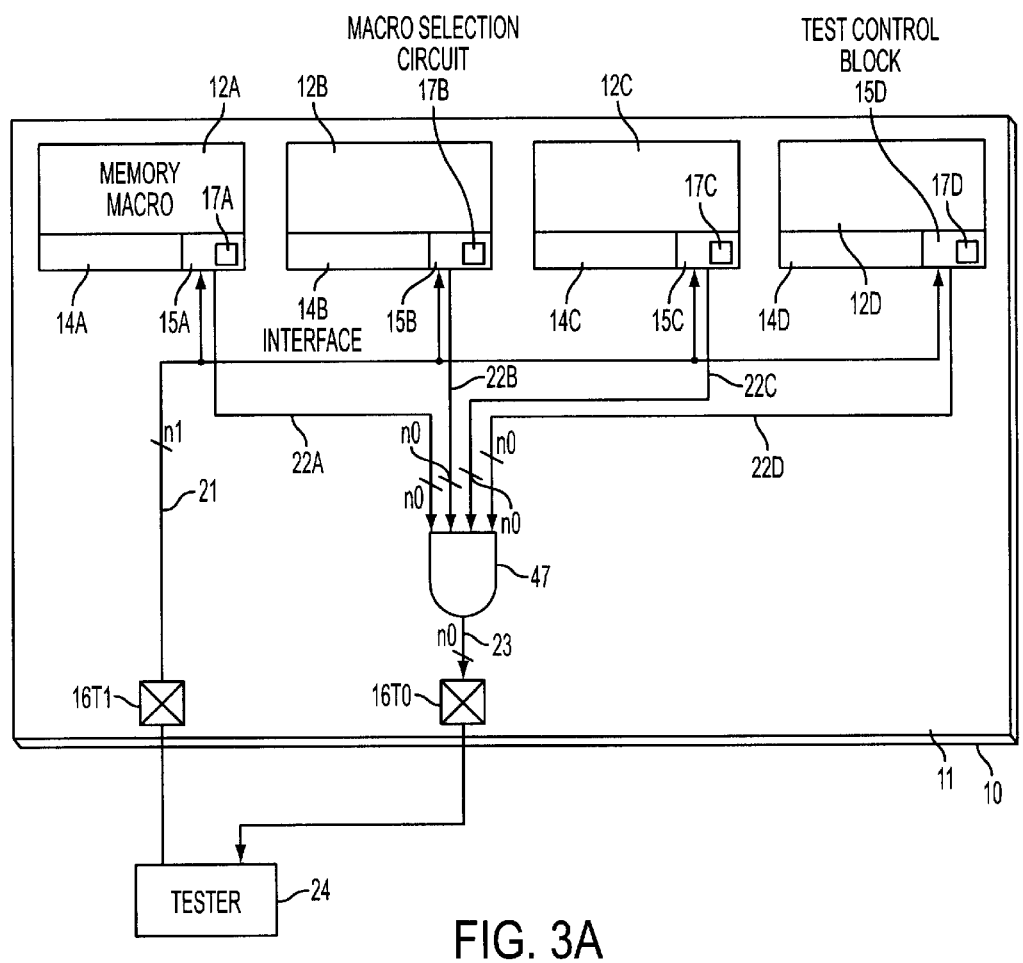
FIGS. 3A and 3B are circuit diagrams, respectively, showing the second embodiment of the memory macro test circuit.
Figure 3B:
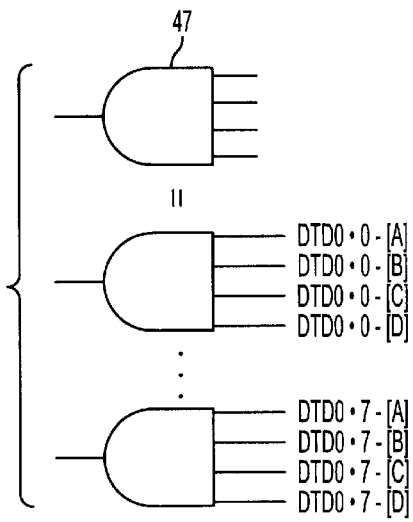

FIGS. 3A and 3B show the second embodiment of the memory macro test circuit of the memory-embedded LSI in FIG. 1.

The test circuit of the second embodiment is different from the test circuit in FIG. 2 in that data of one selected memory macro is logically output outside a semiconductor chip 10 without using any multiplexer in the output selection circuit. The test circuit of the second embodiment does not require any control signal lines 46 in FIG. 2, can eliminate the design labor for the control signal lines, and can reduce interconnection errors. This test circuit can logically select an output to reduce power consumption.

The layout of the test circuit in the second embodiment will be explained.

Four memory macros 12A, 12B, 12C, and 12D are laid out on the semiconductor chip 10. The memory macros 12A, 12B, 12C, and 12D respectively comprise interfaces 14A, 14B, 14C, and 14D for inputting/outputting data, and test control blocks 15A, 15B, 15C, and 15D for controlling a memory macro test.

The test control blocks 15A, 15B, 15C, and 15D respectively comprise macro ID generation circuits for generating macro IDs for identifying the memory macros, and macro selection circuits 17A, 17B, 17C, and 17D for comparing the macro IDs with a macro selection signal (input ID) input externally from the semiconductor chip 10 to the memory macros, and selecting a memory macro.

The macro ID generation circuits may be formed within the memory macros (test control blocks) or outside the memory macros.

Different macro IDS are assigned to the memory macros 12A, 12B, 12C, and 12D. In the second embodiment, since the four memory macros are laid out on the semiconductor chip 10, macro IDs "00", "01", "10", and "11" are respectively assigned to the memory macros 12A, 12B, 12C, and 12D.

A logic section 11 has an input signal line 21 capable of transferring, e.g., nI-bit data, first output signal lines 22A, 22B, 22C, and 22D each capable of transferring nO-bit data, second output signal line 23 capable of transferring nO-bit data, and AND circuit 47.

One end of the input signal line 21 is connected to a pad 16TI, and the other end is commonly connected to the memory macros 12A, 12B, 12C, and 12D. One end of each of the first output signal lines 22A, 22B, 22C, and 22D is connected to a corresponding one of the memory macros 12A, 12B, 12C, and 12D, and the other end is connected to the AND circuit 47. One end of the second output signal line 23 is connected to the output terminal of the AND circuit 47, and the other end is connected to a pad 16TO.

In general, the pads 16TI and 16TO are used to test the memory macros 12A, 12B, 12C, and 12D and to input/output data or control signal to/from the circuit of the logic section 11 under limitations on the number of pads formed on the pad section.

FIG. 3B shows a detailed example of the AND circuit 47 for nO=8. Reference symbols DTDO·0[A] and DTDO·7[A] denote data bits output from the memory macro 12A; DTDO·0[B] and DTDO·7[B], data bits output from the memory macro 12B; DTDO·0[C] and DTDO·7[C], data bits output from the memory macro 12C; and DTDO·0[D] and DTDO·7[D], data bits output from the memory macro 12D. Reference numeral 47__[i] (i=0, . . . , 7) denotes a 4-input AND circuit for receiving DTDO·i(A), DTDO·i(B), DTDO·i (C), and DTDO·i(D), and outputting DTDO·i.

Figure 4:
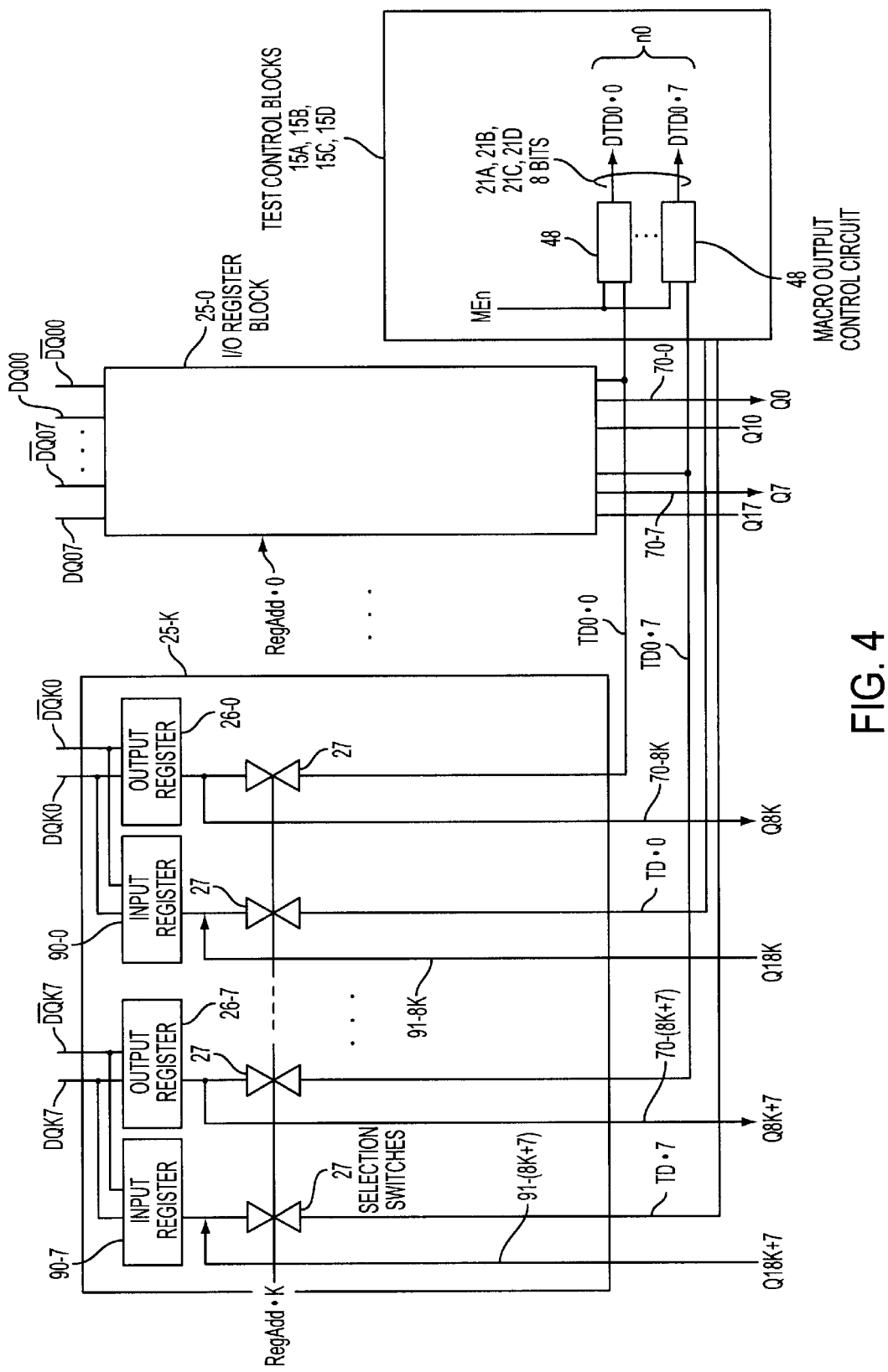
FIG. 4 is a circuit diagram showing an arrangement of the interface of a memory macro in FIG. 3.

FIG. 4 shows an arrangement of the interface 14 in each of the memory macros 12A, 12B, 12C, and 12D in FIG. 3A.

The memory macro has {K (e.g., 31)+1} I/O register blocks 25-0, . . . , 25-K. Each of the I/O register blocks 25-0, . . . , 25-K has, e.g., eight input registers 90-0, . . . , 90-7, eight output registers 26-0, . . . , 26-7, and selection switches 27. Terminals of each input register 90-i (i=0, . . . , 7) and each output register 26-i (i=0, . . . , 7) on the memory macro side are connected to a pair of data lines DQKi and $\overline{DQKi}$ (i=0, . . . , 7).

For example, in the I/O register block 25-K, a terminal of the input register 90-i (i=0, . . . , 7) on the logic section side is connected to an input signal line 91-i (i=8K, . . . , 8K+7), and to a test signal line via the selection switch 27. A terminal of the output register 26-i (i=0, . . . , 7) on the logic section side is connected to an output signal line 70-i (i=8K, . . . , 8K+7), and to a corresponding one of macro output control circuits 48 in each of the test control blocks 15A, 15B, 15C, and 15D via the selection switch 27.

In a test, register address signals RegAdd·0, . . . , RegAdd·K are generated in the test control blocks 15A, 15B, 15C, and 15D. These register address signals RegAdd·0, . . . , RegAdd·K select one of the K I/O register blocks 25-0, . . . , 25-K. A selection switch 27 is turned on in the selected I/O register block, and a selection switch 27 is turned off in the unselected I/O register block.

In a test, eight data bits (1-byte) TD·0, TD·7 are input to the selected I/O register block via test signal lines, and written in memory cells. Eight data bits TDO·0, . . . , TDO·7 read out from memory cells are output from the selected I/O register block to the macro output control circuits 48.

By sequentially selecting the (K+1) I/O register blocks 25-0, . . . , 25-K one by one, all (K+1)×8-bit data are read out from the memory macro outside the semiconductor chip.

The macro output control circuits 48 function to forcibly fix the values of output signals DTDO·0, DTDO·7 to "1". When the memory macro is not selected, the macro output control circuits 48 forcibly fix the values of the output signal bits DTDO·0, . . . , DTDO·7 to "1"; when the memory macro is selected, directly output the output signal bits TDO·0, . . . , TDO·7 as the output signal bits DTDO·0, . . . , DTDO·7.

Figure 5A:
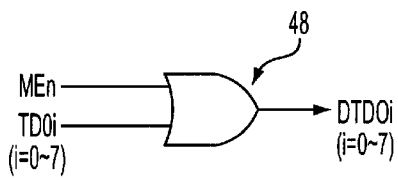
FIGS. 5A and 5B are circuit diagrams, respectively, showing an arrangement of an output control circuit in FIG. 4.

FIG. 5A shows an arrangement of each macro output control circuit 48 in FIG. 4.

In the second embodiment, the macro output control circuits 48 are formed from OR circuits. The OR circuits receive an output signal MEn from the macro selection circuit, and the output signal bits (readout data) TDO·0, . . . , TDO·7 from the output registers.

Since the output signal MEn is "0" in a selected memory macro, the output signal bits DTDO·0, . . . , DTDO·7 from the macro output control circuits 48 are identical to the output signal bits TDO·0, . . . , TDO·7 from the output registers.

To the contrary, since the output signal MEn is "1" in an unselected memory macro, the output signal bits DTDO·0, . . . , DTDO·7 from the macro output control circuits 48 are fixed to "1" regardless of the output signal bits TDO·0, . . . , TDO·7 from the output registers.

The second embodiment shown in FIGS. 3A to 5B adopts the macro output control circuits 48 for fixing the output signal bits DTDO·0, . . . , DTDO·7 from the unselected memory macro to "1". Alternatively, the macro output control circuits 48 may be formed from a circuit in FIG. 5B to fix the output signal bits DTDO·0, . . . , DTDO·7 from the unselected memory macro to "0". In this case, a logic circuit formed in the logic section 11 is an OR circuit instead of the AND circuit 47.

A test method for the memory macro in FIGS. 3A to 5B will be explained.

A macro selection signal (input ID) is supplied from a tester 24 to the memory macros 12A, 12B, 12C, and 12D via the pad 16TI, and power supply voltages VDD and VSS are also supplied to them. The macro ID generation circuits in the test control blocks 15A, 15B, 15C, and 15D generate macro IDs which are compared with the input ID by the macro selection circuits 17A, 17B, 17C, and 17D.

As a result of comparison between the macro IDs and input ID, one of the four memory macros 12A, 12B, 12C, and 12D is selected. The output signal MEn from the macro selection circuit changes to "0" in the selected memory macro, and the output signal MEn changes to "1" in the remaining three unselected memory macros.

The selected memory macro, i.e., the memory macro having an output signal MEn "0" can receive a command. Hence, test operation (data write and read) is enabled in the selected memory macro, but is not enabled in the unselected memory macros, i.e., the memory macros having an output signal MEn "1".

In the selected memory macro, data is written in a memory cell, and then data is read out from a memory cell. For example, in a memory macro having 256 I/Os, 256 data are simultaneously read out. In the second embodiment, the 256 data are divisionally read out every 8 bits (no bits) by 32 operations.

At this time, since MEn="0" is input to the macro output control circuits 48 in the selected memory macro, the eight output signal bits (readout data) TDO·0, . . . , TDO·7 are directly output as the output signal bits DTDO·0, . . . , DTDO·7 from the selected memory macro.

Since MEn="1" is input to the macro output control circuits 48 in the unselected memory macro, the output signal bits DTDO·0, . . . , DTDO·7 from the unselected memory macro are fixed to "1" regardless of the eight output signal bits (readout data) TDO·0, . . . , TDO·7.

The AND circuit 47 of the logic section 11 receives output signal bits DTDO·0, . . . , DTDO·7 "1" or "0" from the selected memory macro, and output signal bits DTDO·0, . . . , DTDO·7 fixed to "1" from the unselected memory macro.

As a result, the AND circuit 47 directly outputs the output signal bits DTDO·0, . . . , DTDO·7 from the selected memory macro.

Data read outside the semiconductor chip 10 is compared with an expected value by the tester 24 to determine whether a memory cell is nondefective or defective based on the comparison result. By sequentially switching the selected memory macro, all the memory macros 12A, 12B, 12C, and 12D can undergo a function test.

The memory macro test circuit having this layout logically outputs data from one selected memory macro outside the semiconductor chip 10 without using any multiplexer in the output selection circuit. The test circuit can eliminate a time for laying out the control signal lines 46 in FIG. 2, and a space for the control signal lines 46 in FIG. 2 in designing the memory-embedded LSI. Further, the test circuit can reduce interconnection errors to increase the design efficiency. Since this test circuit logically selects an output, the circuit can contribute to low power consumption.

The test circuit of the second embodiment can be used for a wafer state test for finding a defective cell in a memory cell array and replacing the defective cell with a redundant cell, and a final test for screening memory cells into nondefectives and defectives after packaging.

Figure 6:
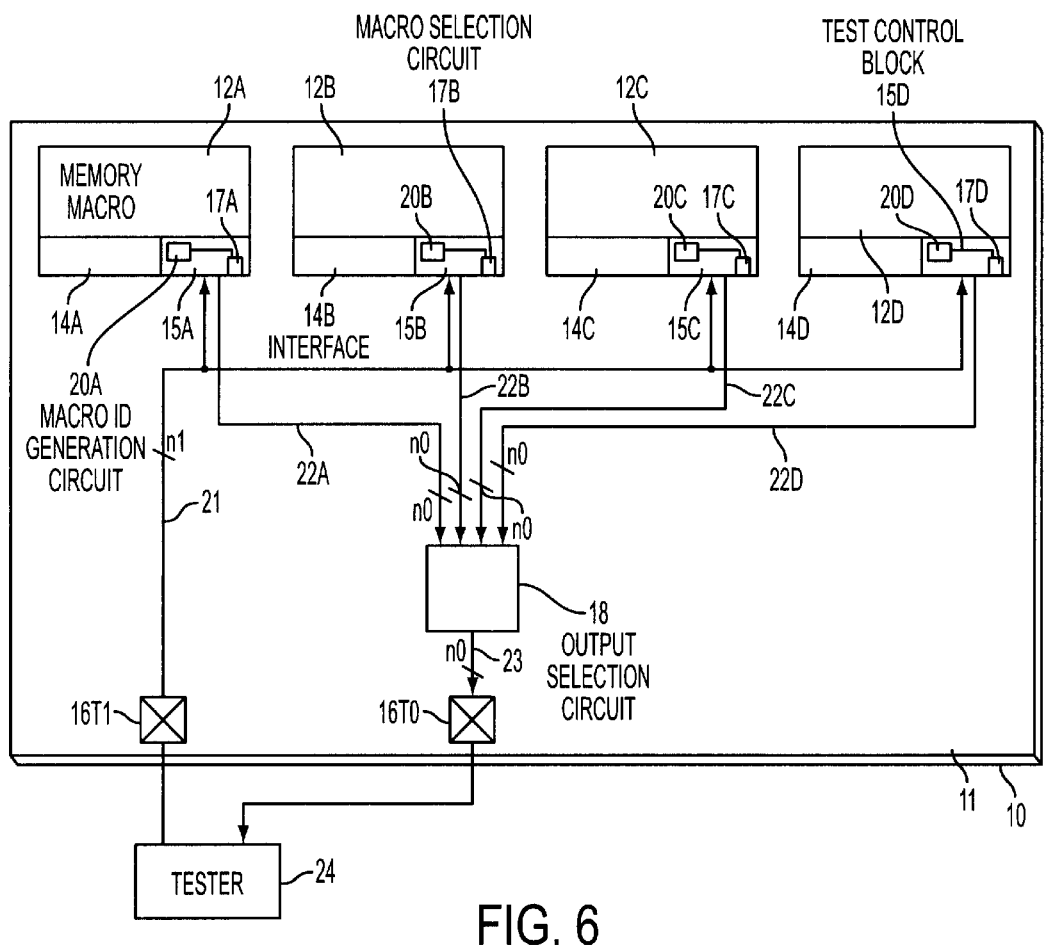
FIG. 6 is a circuit diagram showing the third embodiment of the memory macro test circuit.

FIG. 6 shows the third embodiment of the memory macro test circuit of the memory-embedded LSI in FIG. 1.

The layout of the test circuit in the third embodiment will be explained.

Four memory macros 12A, 12B, 12C, and 12D are laid out on a semiconductor chip 10. The memory macros 12A, 12B, 12C, and 12D respectively comprise interfaces 14A, 14B, 14C, and 14D for inputting/outputting data, and test control blocks 15A, 15B, 15C, and 15D for controlling a memory macro test.

The test control blocks 15A, 15B, 15C, and 15D respectively comprise macro ID generation circuits 20A, 20B, 20C, and 20D for generating macro IDs for identifying the memory macros, and macro selection circuits 17A, 17B, 17C, and 17D for comparing the macro IDs with a macro selection signal (input ID) input externally from the semiconductor chip 10 to the memory macros, and selecting a memory macro.

Different macro IDs are assigned to the memory macros 12A, 12B, 12C, and 12D. In the third embodiment, since the four memory macros are laid out on the semiconductor chip 10, macro IDs "00", "01", "10", and "11" are respectively assigned to the memory macros 12A, 12B, 12C, and 12D.

A logic section 11 has an input signal line 21 capable of transferring, e.g., nI-bit data, first output signal lines 22A, 22B, 22C, and 22D each capable of transferring nO-bit data, second output signal line 23 capable of transferring nO-bit data, and output selection circuit 18.

One end of the input signal line 21 is connected to a pad 16TI, and the other end is commonly connected to the memory macros 12A, 12B, 12C, and 12D. One end of each of the first output signal lines 22A, 22B, 22C, and 22D is connected to a corresponding one of the memory macros 12A, 12B, 12C, and 12D, and the other end is connected to the output selection circuit 18. One end of the second output signal line 23 is connected to the output selection circuit 18, and the other end is connected to a pad 16TO.

The output selection circuit 18 functions to electrically connect one of the first output signal lines 22A, 22B, 22C, and 22D and the second output signal line 23.

In general, the pads 16TI and 16TO are used to test the memory macros 12A, 12B, 12C, and 12D and to input/output data or control signal to/from the circuit of the logic section 11 under limitations on the number of pads formed on the pad section. In this case, multiplexers are arranged midway along the input signal line 21 and second output signal line 23 to switch the functions of the pads 16TI and 16TO. If the semiconductor chip 10 has enough pads, the pads 16TI and 16TO may be dedicated for a test.

The number of pads 16TI is set to, e.g., nI in correspondence with the number of input signal lines 21, and the number of pads 16TO is set to, e.g., nO in correspondence with the number of second output signal lines 23. Note that the numbers of pads 16TI and 16TO may be set smaller than nI and nO, respectively.

Figure 7:
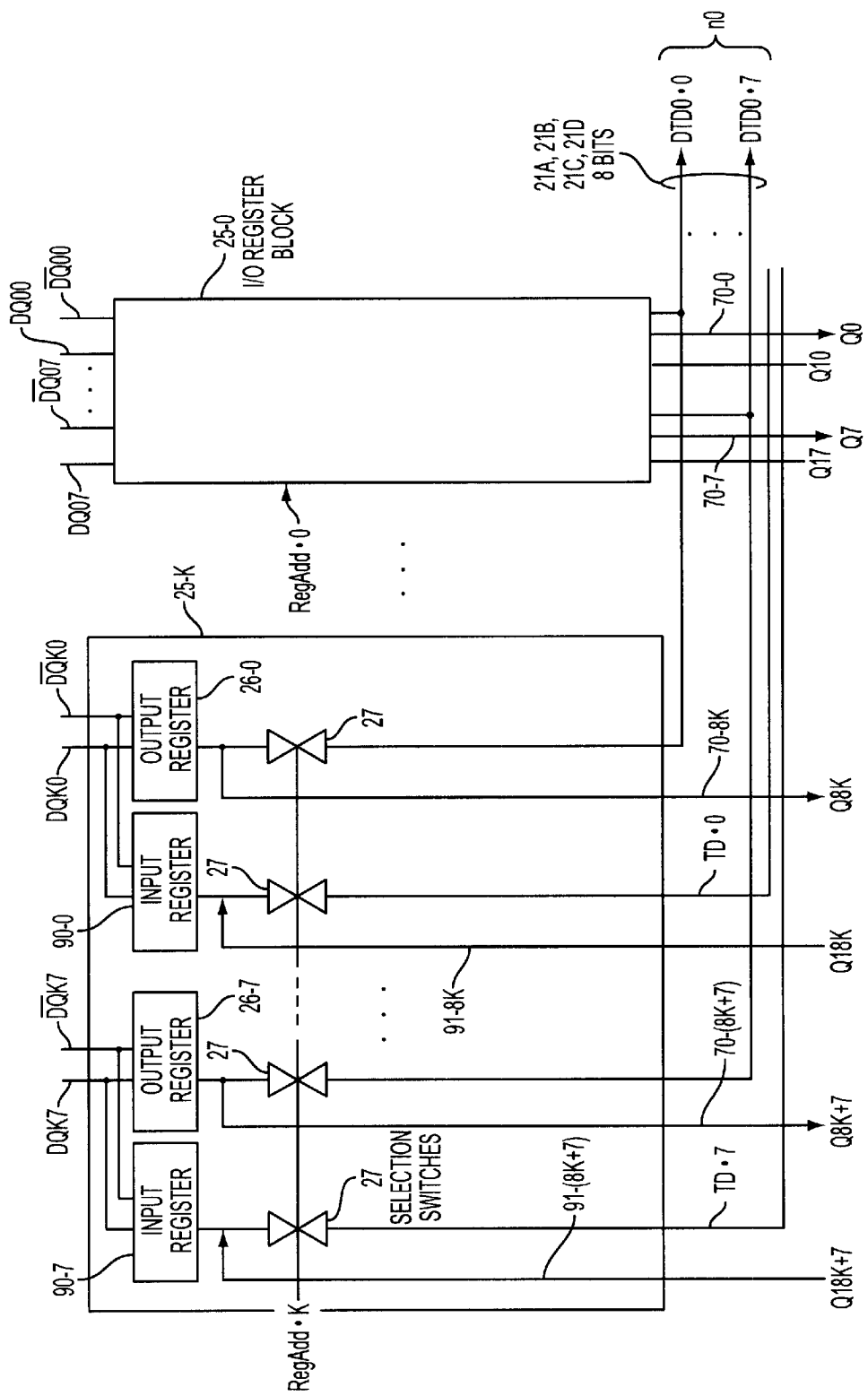
FIG. 7 is a circuit diagram showing an arrangement of the interface of a memory macro in FIG. 6.

FIG. 7 shows an arrangement of the interface 14 in each of the memory macros 12A, 12B, 12C, and 12D in FIG. 6.

One memory macro has {K (e.g., 31)+1} I/O register blocks 25-0, ..., 25-K. Each of the I/O register blocks 25-0, ..., 25-K has, e.g., eight input registers 90-0, ..., 90-7, eight output registers 26-0, ..., 26-7, and selection switches 27. Terminals of each input register 90-i (i=0, ..., 7) and each output register 26-i (i=0, ..., 7) on the memory macro side are connected to a pair of data lines DQKi and $\overline{DQKi}$ (i=0, ..., 7).

For example, in the I/O register block 25-K, a terminal of the input register 90-i (i=0, ..., 7) on the logic section side is connected to an input signal line 91-i (i=8K, ..., 8K+7), and to a test signal line via the selection switch 27. A terminal of the output register 26-i (i=0, ..., 7) on the logic section side is connected to an output signal line 70-i (i=8K, ..., 8K+7), and to a corresponding one of first output signal lines 21A, 21B, 21C, and 21D via the selection switch 27.

In the third embodiment, the memory macro in a normal state has (K+1)×8-bit input data QI0, ..., QI(8K+7), and (K+1)×8-bit output data Q0, ..., Q(8K+7). The input data QI0, ..., QI(8K+7) are input from the logic section to the memory macro via the input signal lines 91-0, ..., 91-(8K+7). The output data Q0, ..., Q(8K+7) are output from the memory macro to the logic section via the output signal lines 70-0, ..., 70-(8K+7).

In a test, register address signals RegAdd·0, ..., RegAdd·K are generated in the test control blocks. These register address signals RegAdd·0, ..., RegAdd·K select one of the (K+1) I/O register blocks 25-0, ..., 25-K. A selection switch 27 is turned on in the selected I/O register block, and a selection switch 27 is turned off in the unselected I/O register block.

In a test, eight data bits TD·0, ..., TD·7 are input from test signal lines to the input registers 90-0, ..., 90-7 in the selected I/O register block. Eight data bits DTDO·0, ..., DTDO·7 are output from the selected I/O register block to the first output signal lines 21A, 21B, 21C, and 21D.

To read out all the (K+1)×8-bit data from the memory macro outside the semiconductor chip, the (K+1) I/O register blocks 25-0, ..., 25-K are sequentially selected one by one.

The number of output data in a test is much smaller than the number of input/output data in a normal state because the number of pads for outputting data outside the semiconductor chip in a test is limited.

Figure 8:
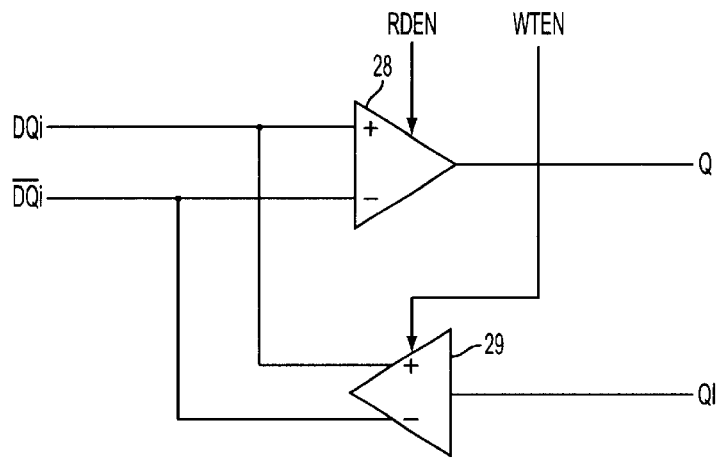
FIG. 8 is a circuit diagram showing an example of an input/output register in FIG. 7.

FIG. 8 shows arrangements of the input registers 90-0, ..., 90-7 and output registers 26-0, ..., 26-7 in FIG. 7.

The input register and output register are formed from an input buffer 29 and output buffer 28, respectively. The input buffer 29 is controlled by a write control signal WTEN to output data Qi or test data TDi as complementary data to a pair of data lines DQi and $\overline{DQi}$. The output buffer 28 is controlled by a read control signal RDEN to output complementary data on the pair of data lines DQi and $\overline{DQi}$ as the data Qi or test data DTDO·i.

A test method for the memory macro in FIG. 6 will be explained.

A macro selection signal (input ID) is supplied from a tester 24 to the memory macros 12A, 12B, 12C, and 12D via the pad 16TI, and power supply voltages VDD and VSS are also supplied to them. The macro ID generation circuits 20A, 20B, 20C, and 20D in the test control blocks 15A, 15B, 15C, and 15D generate macro IDs which are compared with the input ID by the macro selection circuits 17A, 17B, 17C, and 17D. As a result of comparison between the macro IDS and input ID, one of the four memory macros 12A, 12B, 12C, and 12D is selected.

For example, the memory macros 12A, 12B, 12C, and 12D generate macro IDs "00", "01", "10", and "11", respectively. When the input ID is "00", the memory macro 12A is selected, and the remaining memory macros 12B, 12C, and 12D are kept unselected.

The selected memory macro 12A can receive a command. Hence, test operation (data write and read) is enabled in the selected memory macro 12A, but is not enabled in the unselected memory macros 12B, 12C, and 12D.

In the selected memory macro 12A, data is written in a memory cell, and then data is read out from a memory cell. For example, in a memory macro having 256 I/Os, 256 data are simultaneously read out. In the third embodiment, the 256 data are divisionally read out every 8 bits (no bits) by 32 operations to the tester 24 outside the semiconductor chip 10. At this time, the output selection circuit 18 electrically connects to the second output signal line 23 the first output signal line 22A connected to the selected memory macro 12A.

Data read outside the semiconductor chip 10 is compared with an expected value by the tester 24 to determine whether a memory cell is nondefective or defective based on the comparison result.

After the memory macro 12A is tested, the memory macros 12B, 12C, and 12D are sequentially tested to perform a function test for all the memory macros 12A, 12B, 12C, and 12D.

The memory macro test circuit having this layout can directly test the memory macro incorporated in the semiconductor chip 10 using, e.g., the tester outside the semiconductor chip 10 (direct memory access mode).

The test circuit of the third embodiment can be used for a wafer state test for finding a defective cell in a memory cell array and replacing the defective cell with a redundant cell, and a final test for classifying memory cells into nondefectives and defectives after packaging.

The memory macros 12A, 12B, 12C, and 12D incorporate the macro ID generation circuits 20A, 20B, 20C, and 20D for generating macro IDs for identifying the memory macros in sequentially testing the plurality of memory macros 12A, 12B, 12C, and 12D one by one. The macro ID generation circuits 20A, 20B, 20C, and 20D must generate different macro IDs for the respective memory macros, and thus have different layouts for the respective memory macros.

On the other hand, to shorten the design time, the memory-embedded LSI adopts a design method of preparing a circuit block whose functions and characteristics are confirmed, and using this circuit block in designing a memory macro according to a user's demand.

If the macro ID generation circuits 20A, 20B, 20C, and 20D are different between the respective memory macros, the test control blocks 15A, 15B, 15C, and 15D corresponding to the number of memory macros must be designed for the respective memory macros every time the memory-embedded LSI is designed. This spends a long design time, and impairs the effects of the design method using the circuit block.

Figure 9:
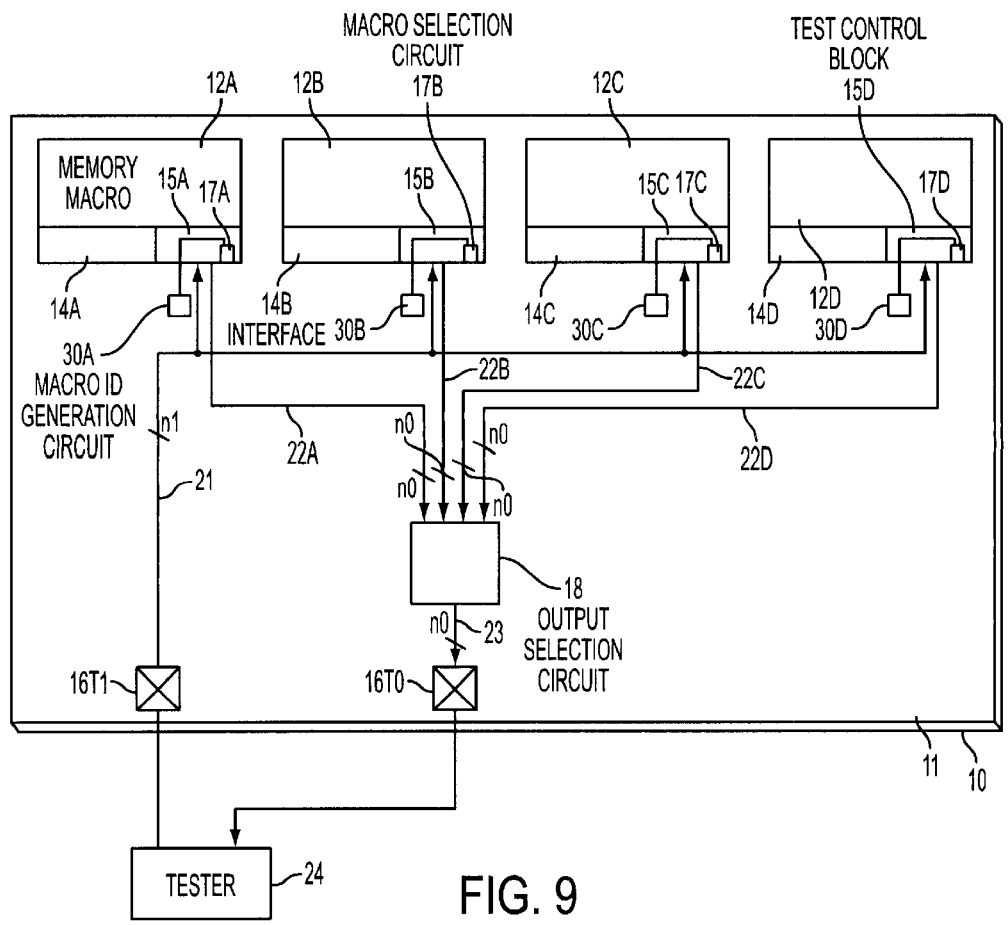
FIG. 9 is a circuit diagram showing the fourth embodiment of the memory macro test circuit.

FIG. 9 shows the fourth embodiment of the memory macro test circuit of the memory-embedded LSI in FIG. 1.

The test circuit of the fourth embodiment is characterized in that macro ID generation circuits 30A, 30B, 30C, and 30D exist outside test control blocks 15A, 15B, 15C, and 15D, i.e., memory macros 12A, 12B, 12C, and 12D, and the test control blocks 15A, 15B, 15C, and 15D in all the memory macros 12A, 12B, 12C, and 12D have the same circuit pattern. In designing the memory-embedded LSI, the test control blocks 15A, 15B, 15C, and 15D having the same pattern can be used regardless of the number of memory macros, which contributes to a short design time.

The layout of the test circuit in the fourth embodiment will be explained.

The four memory macros 12A, 12B, 12C, and 12D are laid out on a semiconductor chip 10. The memory macros 12A, 12B, 12C, and 12D respectively comprise interfaces 14A, 14B, 14C, and 14D for inputting/outputting data, and the test control blocks 15A, 15B, 15C, and 15D for controlling a memory macro test.

Each of the interfaces 14A, 14B, 14C, and 14D is constituted by a circuit as shown in FIGS. 7 and 8, similar to the embodiment in FIG. 6.

The test control blocks 15A, 15B, 15C, and 15D have the same circuit layout between all the memory macros 12A, 12B, 12C, and 12D. In designing the memory-embedded LSI, the test control block need not be redesigned, and a short design time and low manufacturing cost can be realized.

The macro ID generation circuits 30A, 30B, 30C, and 30D for generating macro IDS for identifying the memory macros are arranged on a logic section 11 outside the memory macros 12A, 12B, 12C, and 12D. The macro ID generation circuits 30A, 30B, 30C, and 30D respectively correspond to the memory macros 12A, 12B, 12C, and 12D. The macro ID generation circuits 30A, 30B, 30C, and 30D generate different macro IDS in order to identify the memory macros, and thus have different circuit layouts.

The test control blocks 15A, 15B, 15C, and 15D respectively comprise macro selection circuits 17A, 17B, 17C, and 17D for comparing the macro IDS with a macro selection signal (input ID) input externally from the semiconductor chip 10 to the memory macros, and selecting a memory macro.

The logic section 11 has an input signal line 21 capable of transferring, e.g., nI-bit data, first output signal lines 22A, 22B, 22C, and 22D each capable of transferring nO-bit data, second output signal line 23 capable of transferring nO-bit data, and output selection circuit 18.

One end of the input signal line 21 is connected to a pad 16TI, and the other end is commonly connected to the memory macros 12A, 12B, 12C, and 12D. One end of each of the first output signal lines 22A, 22B, 22C, and 22D is connected to a corresponding one of the memory macros 12A, 12B, 12C, and 12D, and the other end is connected to the output selection circuit 18. One end of the second output signal line 23 is connected to the output selection circuit 18, and the other end is connected to a pad 16TO.

The output selection circuit 18 functions to electrically connect one of the first output signal lines 22A, 22B, 22C, and 22D and the second output signal line 23.

Similar to the embodiment in FIG. 6, the pads 16TI and 16TO are used for a test and for inputting/outputting data or control signal to/from the circuit of the logic section 11 under limitations on the number of pads formed on the pad section. If the semiconductor chip 10 has enough pads, the pads 16TI and 16TO may be dedicated for a test.

The number of pads 16TI is set to, e.g., nI in correspondence with the number of input signal lines 21, and the number of pads 16TO is set to, e.g., no in correspondence with the number of second output signal lines 23. Note that the numbers of pads 16TI and 16TO may be set smaller than nI and nO, respectively.

A test method for the memory macro in FIG. 9 will be explained.

A macro selection signal (input ID) is supplied from a tester 24 to the memory macros 12A, 12B, 12C, and 12D via the pad 16TI, and power supply voltages VDD and VSS are also supplied to them. A signal such as the macro selection signal input to the memory macro is encoded because the number of pads is limited. In general, the test control blocks 15A, 15B, 15C, and 15D decode the macro selection signal. However, if the test circuit has enough pads, an uncoded signal may be directly supplied to the memory macros 12A, 12B, 12C, and 12D.

The macro ID generation circuits 30A, 30B, 30C, and 30D generate macro IDS which are input to the test control blocks 15A, 15B, 15C, and 15D. The macro selection circuits 17A, 17B, 17C, and 17D compare the macro IDS with the input ID. As a result of comparison between the macro IDS and input ID, one of the four memory macros 12A, 12B, 12C, and 12D is selected.

For example, macro IDS "00", "01", "10", and "11" are respectively input to the memory macros 12A, 12B, 12C, and 12D. When the input ID is "01", the memory macro 12B is selected, and the remaining memory macros 12A, 12C, and 12D are kept unselected.

The selected memory macro 12B can receive a command. Hence, test operation (data write and read) is enabled in the selected memory macro 12B, but is not enabled in the unselected memory macros 12A, 12C, and 12D.

In the selected memory macro 12B, data is written in a memory cell, and then data is read out from a memory cell. For example, in a memory macro having 256 I/Os, 256 data are simultaneously read out. In the fourth embodiment, the 256 data are divisionally read out every 8 bits (no bits) by 32 operations to the tester 24 outside the semiconductor chip 10. At this time, the output selection circuit 18 electrically connects to the second output signal line 23 the first output signal line 22B connected to the selected memory macro 12B.

Data read outside the semiconductor chip 10 is compared with an expected value by the tester 24 to determine whether a memory cell is nondefective or defective based on the comparison result.

By sequentially performing a function test for the memory macros 12A, 12B, 12C, and 12D, all the memory macros 12A, 12B, 12C, and 12D can undergo the function test.

The memory macro test circuit having this layout can directly test the memory macro incorporated in the semiconductor chip 10 using, e.g., the tester outside the semiconductor chip 10.

The test circuit logically outputs data from one selected memory macro outside the semiconductor chip 10. The test circuit can eliminate the control signal lines 46 in FIG. 2 in designing the memory-embedded LSI, can reduce the design load and interconnection errors, and can increase the design efficiency. Since this test circuit logically selects an output, the circuit can contribute to low power consumption.

In the fourth embodiment, the macro ID generation circuits 30A, 30B, 30C, and 30D for generating macro IDs for identifying the memory macros are arranged outside the memory macros 12A, 12B, 12C, and 12D. In designing the memory-embedded LSI, the test control blocks 15A, 15B, 15C, and 15D having the same pattern can be used for all the memory macros 12A, 12B, 12C, and 12D. This can reduce the design load and can shorten the design time.

The test circuit of the fourth embodiment can also be used for a wafer state test for finding a defective cell in a memory cell array and replacing the defective cell with a redundant cell, and a final test for classifying memory cells into nondefectives and defectives after packaging.

Figure 10:
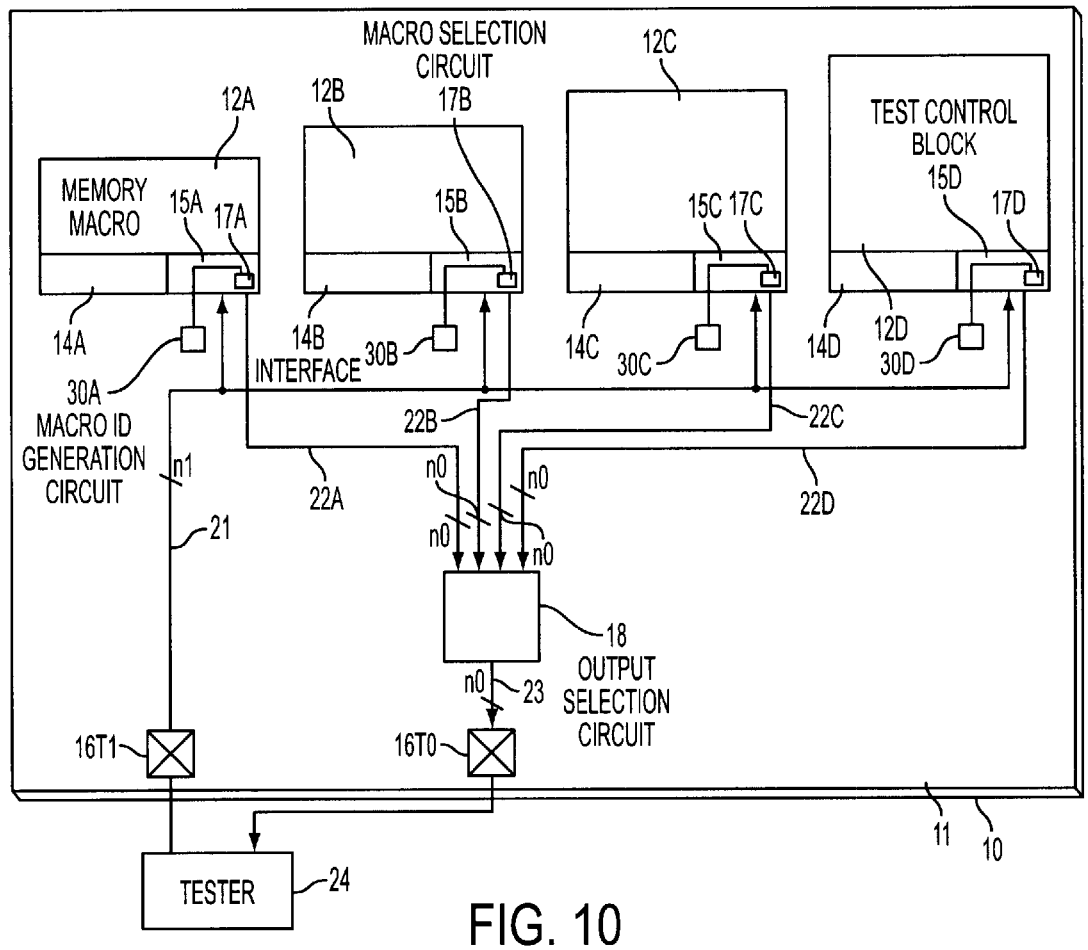
FIG. 10 is a circuit diagram showing the fifth embodiment of the memory macro test circuit.

FIG. 10 shows the fifth embodiment of the memory macro test circuit of the memory-embedded LSI in FIG. 1.

The test circuit of the fifth embodiment has all the features of the test circuit in FIG. 9, and comprises memory macros 12A, 12B, 12C, and 12D having different memory capacities. That is, in the test circuit of FIG. 9, the memory macros 12A, 12B, 12C, and 12D to be tested have the same memory capacity. In the test circuit of the fifth embodiment, the memory macros 12A, 12B, 12C, and 12D to be tested do not have the same memory capacity.

In general, the memory macro of the memory-embedded LSI can be designed within a short time with an arbitrary memory capacity corresponding to a user's demand by changing the number of pre-designed memory segments (or blocks) having a predetermined memory capacity. An increase/decrease in memory capacity of the memory macro does not change the layout of test control blocks 15A, 15B, 15C, and 15D, and particularly macro selection circuits 17A, 17B, 17C, and 17D.

Accordingly, the present invention can also be applied to a memory-embedded LSI having a plurality of memory macros with different memory capacities.

A memory macro test method according to the fifth embodiment is the same as that using the test circuit in FIG. 9, and a description thereof will be omitted.

Figure 11:
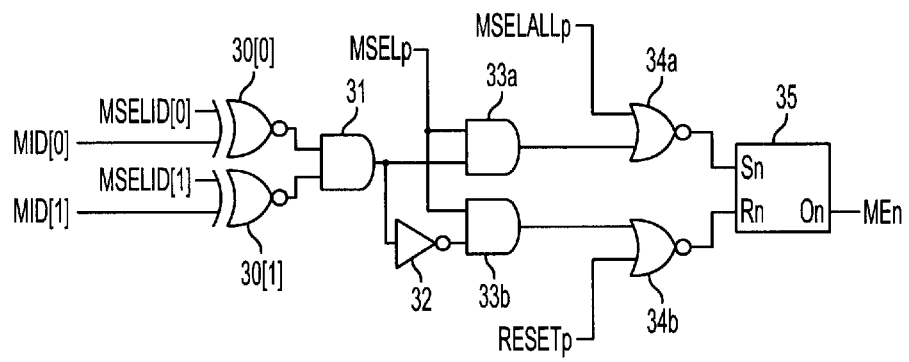
FIG. 11 is a circuit diagram showing an arrangement of a macro selection circuit.

FIG. 11 shows an arrangement of the macro selection circuit in the test control block.

A macro selection signal MSELp represents a macro selection command. When the macro selection signal MSELp is "1", the macro selection command is performed. A reset signal RESETp resets the state of the test circuit, and when a reset command is input, changes to "1". An all-macro selection signal MSELALLp selects all the memory macros, and when an all-macro selection command is input, changes to "1".

The macro selection signal MSELp, reset signal RESETp, and all-macro selection signal MSELALLp are generated from a coded signal input to the semiconductor chip via the pad 16TI in, e.g., FIG. 2, 3A, 6, 9, or 10. Signal bits MID[0] and MID[1] represent a macro ID output from the macro ID generation circuit in, e.g., FIG. 2, 3A, 6, 9, or 10, and change for respective memory macros. In the fifth embodiment, the four memory macros are recognized by the two signal bits MID[0] and MID[1]. Signals MSELID[0] and MSELID[1] represent an input ID.

In FIG. 11, reference numerals 30[0] and 30[1] denote Ex-NOR circuits; 31, 33a, and 33b, AND circuits; 32, an inverter circuit; 34a and 34b, NOR circuits; and 35, a NAND·RS latch circuit. In the NAND·RS latch circuit 35, Qn="0" holds for Sn="0" and Rn="1", Qn="1" holds for Sn="1" and Rn="0", and output holding operation is executed for Sn="1" and Rn="1".

MID[0] and MSELID[0] are input to the Ex-NOR circuit 30[0]. MID[1] and MSELID[1] are input to the Ex-NOR circuit 30[1]. Outputs from the Ex-NOR circuits 30[0] and 30[1] are input to the AND circuit 31. An output from the AND circuit 31 is input to the inverter 32. The macro selection signal MSELp and an output from the AND circuit 31 are input to the AND circuit 33a. The macro selection signal MSELp and an output from the inverter circuit 32 are input to the AND circuit 33b. An output from the AND circuit 33a and the all-macro selection signal MSELALLp are input to the NOR circuit 34a. The reset signal RESETp and the output signal of the AND circuit 33b are input to the NOR circuit 34b. An output from the NOR circuit 34a is input to the set terminal Sn of the NAND·RS latch circuit 35, whereas an output from the NOR circuit 34b is input to the reset terminal Rn of the NAND·RS latch circuit 35. The output On from the NAND·RS latch circuit 35 serves as the macro selection signal MEn.

Memory macro selection operation is performed as follows.

When a macro selection command is generated in the test control block of each memory macro, the macro selection signal MSELp changes to "1" in all the memory macros. The Ex-NOR circuits 30[0] and 30[1] compare the macro ID bits MID[0] and MID[1] with the input ID bits MSELID[0] and MSELID[1].

In a memory macro where the macro ID bits MID[0] and MID[1] and input ID bits MSELID[0] and MSELID[1] coincide with each other, output signals from both the Ex-NOR circuits 30[0] and 30[1] are "1", and an output signal from the AND circuit 31 is also "1". Since the macro selection signal MSELP is "1", output signals from the AND circuits 33a and 33b are "1" and "0", respectively.

Since both the reset signal RESETp and all-macro selection signal MSELALLp are "0", output signals from the NOR circuits 34a and 34b are "0" and "1", respectively. In the NAND·RS latch circuit 35, Sn="0", Rn="1", and On (MEn)="0" hold, and On (MEn)="0" is latched.

In a memory macro where the macro ID bits MID[0] and MID[1] and input ID bits MSELID[0] and MSELID[1] do not coincide with each other, output signals from both the Ex-NOR circuits 30[0] and 30[1] do not become "1", so that an output signal from the AND circuit 31 is "0". Since the macro selection signal MSELp is "1", output signals from the AND circuits 33a and 33b are "0" and "1", respectively.

Since both the reset signal RESETp and all-macro selection signal MSELALLp are "0", output signals from the NOR circuits 34a and 34b are "1" and "0", respectively. In the NAND·RS latch circuit 35, Sn="1", Rn=0, and On (MEn)="1" hold, and On (MEn)="1" is latched.

Note that the output signal latched once in the NAND·RS latch circuit 35 is not disabled until a macro selection command is generated again to select another memory macro, or a reset command is generated.

Figure 12:
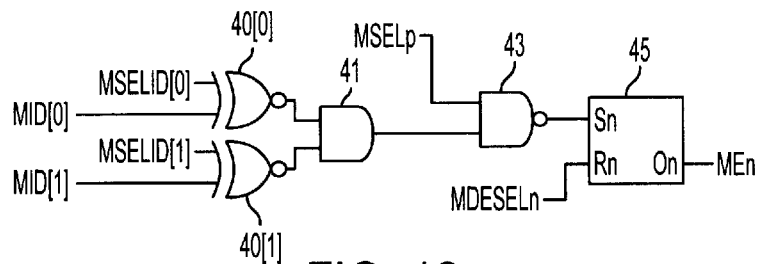
FIG. 12 is a circuit diagram showing another arrangement of the macro selection circuit.

FIG. 12 shows another arrangement of the macro selection circuit in the test control block.

The macro selection signal MSELp represents a macro selection command. When the macro selection signal MSELp is "1", the macro selection command is performed. A macro selection cancel signal MDESELn cancels the selected state of the memory macro, and when a macro selection cancel command is generated, changes to "0".

The macro selection signal MSELp and macro selection cancel signal MDESELn are generated from a coded signal input to the semiconductor chip via the pad 16TI in, e.g., FIG. 2, 3A, 6, 9, or 10. The macro selection signal MSELp is generated in the test control blocks of all the memory macros.

The macro selection cancel signal MDESELn is generated in the test control blocks of all the memory macros.

The signal bits MID[0] and MID[1] represent a macro ID output from the macro ID generation circuit in, e.g., FIG. 2, 3A, 6, 9, or 10, and change for respective memory macros. In the fifth embodiment, the four memory macros are recognized by the two signal bits MID[0] and MID[1]. The signal bits MSELID[0] and MSELID[1] represent an input ID.

In FIG. 12, reference numerals 40[0] and 40[1] denote Ex-NOR circuits; 41, an AND circuit; 43, a NAND circuit; and 45, a NAND·RS latch circuit.

MID[0] and MSELID[0] are input to the Ex-NOR circuit 40[0]. MID[1] and MSELID[1] are input to the Ex-NOR circuit 40[1]. Outputs from the Ex-NOR circuits 40[0] and 40[1] are input to the AND circuit 41. An output from the AND circuit 41 and the macro selection signal MSELp are input to the NAND circuit 43. An output from the NAND circuit 43 is input to the set terminal Sn of the NAND·RS latch circuit 45. The macro selection cancel signal MDESELn is input to the reset terminal Rn of the NAND·RS latch circuit 45. The output On from the NAND·RS latch circuit 45 serves as the macro selection signal MEn.

Memory macro selection operation is performed as follows.

When a macro selection command is generated in the test control block of each memory macro, the macro selection signal MSELp changes to "1" in all the memory macros. The Ex-NOR circuits 40[0] and 40[1] compare the macro ID bits MID[0] and MID[I] with the input ID bits MSELID[0] and MSELID[1].

In a memory macro where the macro ID bits MID[0] and MID[1] and input ID bits MSELID[0] and MSELID[1] coincide with each other, output signals from both-the Ex-NOR circuits 40[0] and 40[1] are "1", and an output signal from the AND circuit 41 is also "1". Since the macro selection signal MSELp is "1", an output signal from the NAND circuit 43 is "0", and the output signal On (MEn) from the NAND·RS latch circuit 45 is latched at "0".

In a memory macro where the macro ID bits MID[0] and MID[1] and input ID bits MSELID[0] and MSELID[1] donot coincide with each other, output signals from both the Ex-NOR circuits 40[0] and 40[1] do not become "1", so that an output signal from the AND circuit 41 is "0". Since the macro selection signal MSELp is "1", an output signal from the NAND circuit 43 is "1", and the output signal On (MEn) from the NAND·RS latch circuit 45 is latched at "1".

Note that the output signal latched once in the NAND·RS latch circuit 45 is not disabled until the macro selection cancel signal MDESELn is input.

Figure 13:
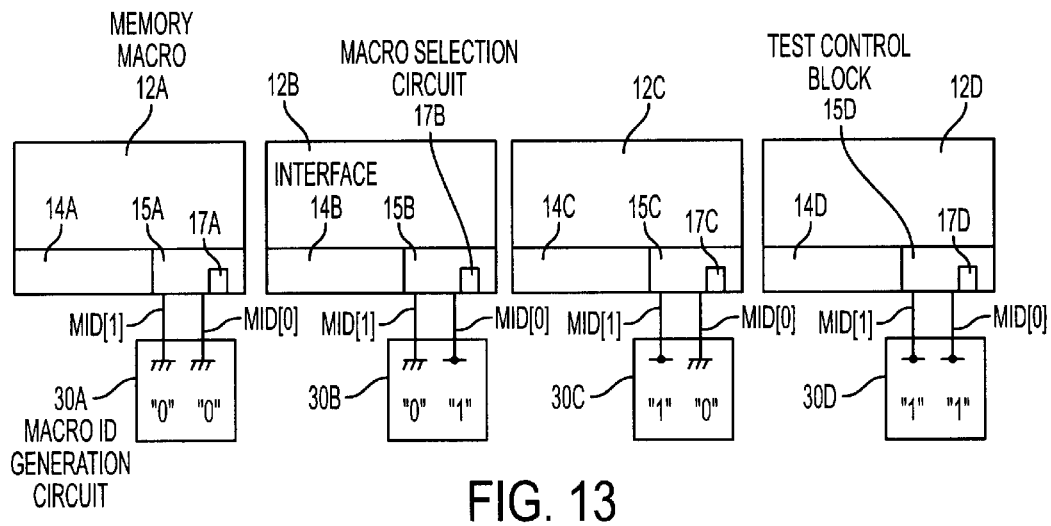
FIG. 13 is a circuit diagram showing an arrangement of a macro ID generation circuit.

FIG. 13 shows an arrangement of macro ID generation circuits 30A, 30B, 30C, and 30D shown in FIGS. 9 and 10.

In the fifth embodiment, the four memory macros are laid out in one chip, and the macro ID is made up of the two signal bits MID[0] and MID[1], as described above. In general, $2^n$ memory macros can be identified by an n-bit macro ID.

The macro ID generation circuit 30A generates a macro ID for the memory macro 12A, and the macro ID is "00". In this case, "0" can be represented by a ground potential VSS. Therefore, the ground potential VSS is applied to two input nodes for supplying the signal bits MID[0] and MID[1] to the macro selection circuit 17A of the memory macro 12A.

The macro ID generation circuit 30B generates a macro ID for the memory macro 12B, and the macro ID is "01". In this case, "0" and "1" can be respectively represented by the ground potential VSS and power supply potential VDD. Therefore, the power supply potential VDD is applied to one of two input nodes for supplying the signal bits MID[0] and MID[1] to the macro selection circuit 17B of the memory macro 12B, whereas the ground potential VSS is applied to the other input node.

Similarly, the macro ID generation circuits 30C and 30D generate macro IDS for the memory macros 12C and 12D, and these macro IDs are "10", and "11", respectively. The ground potential VSS is applied to one of two input nodes for supplying the signal bits MID[0] and MID[1] to the macro selection circuit 17C of the memory macro 12C, whereas the power supply potential VDD is applied to the other input node. The power supply potential VDD is applied to two input nodes for supplying the signal bits MID[0] and MID[1] to the macro selection circuit 17D of the memory macro 12D.

The macro ID generation circuits 30A, 30B, 30C, and 30D have different circuit layouts for the respective memory macros. Using the macro ID generation circuit having the above-mentioned layout, a macro ID corresponding to each memory macro can be generated with a simple layout, resulting in a short design time.

Figure 14A:
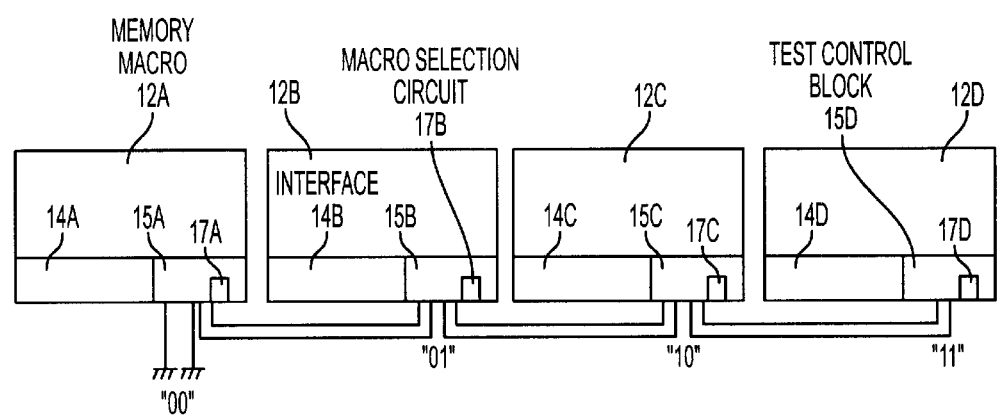
FIGS. 14A and 14B are circuit diagrams each showing another arrangement of the macro ID generation circuit.
Figure 14B:
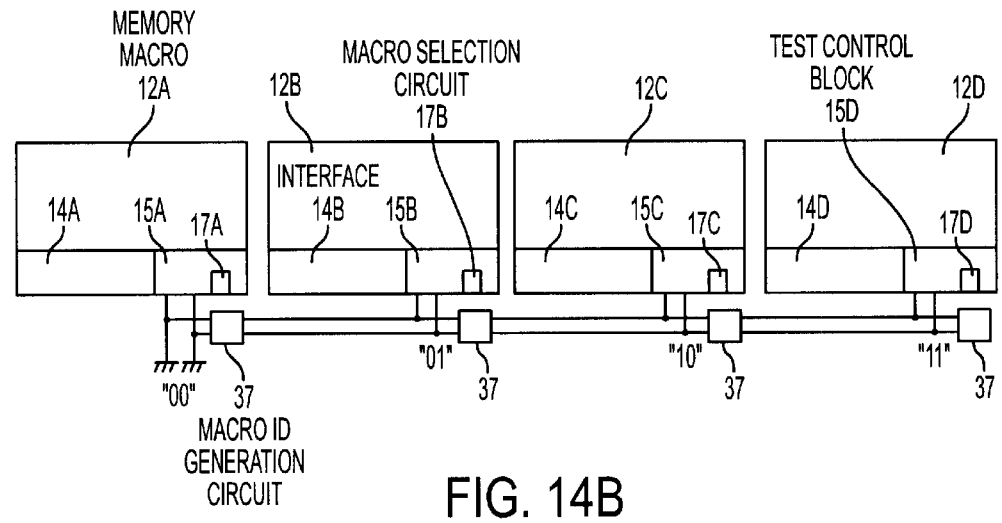

FIGS. 14A and 14B show modifications of the macro ID generation circuits 30A, 30B, 30C, and 30D shown in FIG. 13.

In the arrangement of FIG. 13, the power supply lines VDD and VSS are directly connected to the two macro ID input nodes in each memory macro. In these modifications, however, the power supply line VSS is directly connected to the two macro ID input nodes only in one memory macro 12A, and the two signal bits MID[0] and MID[1] are generated based on signals output from the memory macros 12A, 12B, and 12C in the remaining memory macros 12B, 12C, and 12D.

Figure 15:
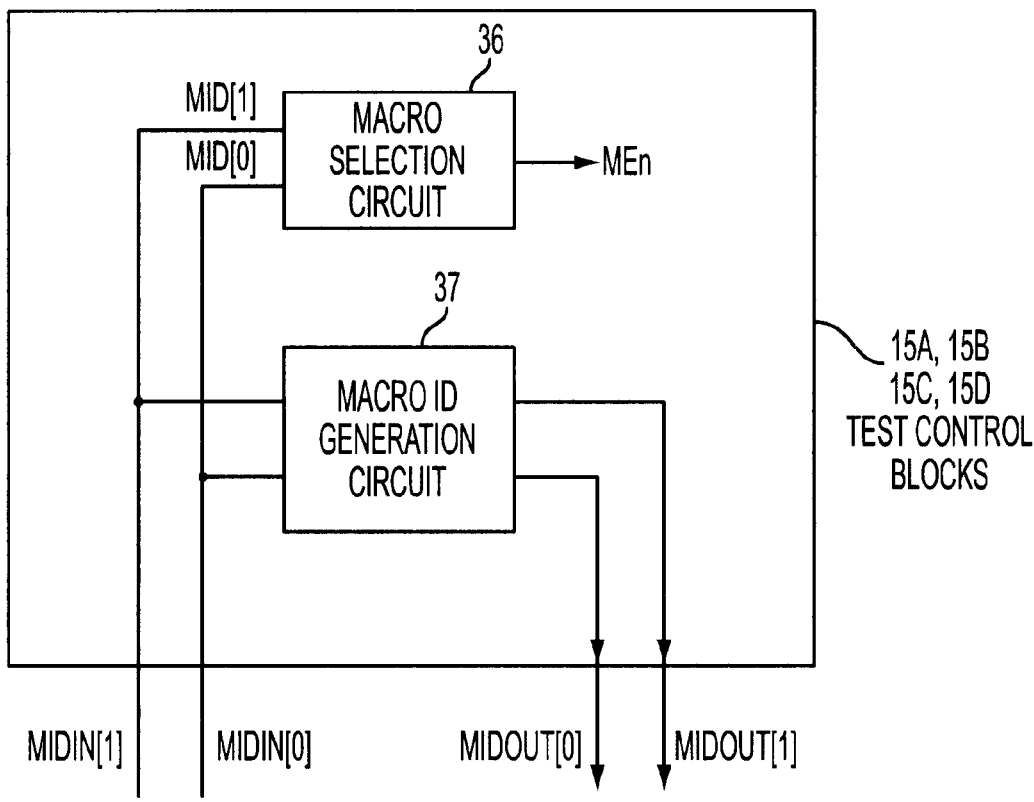
FIG. 15 is a circuit diagram showing the macro ID generation circuit in a test control block.

FIG. 15 shows an arrangement of the test control blocks 15A, 15B, 15C, and 15D in FIG. 14A.

As a macro selection circuit 36, a circuit as shown in FIG. 11 or 12 is used. Macro ID generation circuits 37 are formed in the test control blocks 15A, 15B, 15C, and 15D of all the memory macros 12A, 12B, 12C, and 12D, and have the same circuit layout between all the memory macros 12A, 12B, 12C, and 12D.

The macro ID of the memory macro 12A is "00". The macro ID generation circuit 37 formed in the test control block 15A of the memory macro 12A generates a macro ID "01" for the memory macro 12B on the basis of the macro ID "00". The macro ID generation circuit 37 formed in the test control block 15B of the memory macro 12B generates a macro ID "10" for the memory macro 12C on the basis of the macro ID "01". The macro ID generation circuit 37 formed in the test control block 15C of the memory macro 12C generates a macro ID "11" for the memory macro 12D on the basis of the macro ID "10". The output terminal of the macro ID generation circuit 37 formed in the test control block 15D of the memory macro 12D is connected nowhere.

In the fifth embodiment, the macro ID generation circuits 37 have an adder function of adding input signals and generating output signals, and can be connected like a chain to generate macro IDs.

Figure 16:
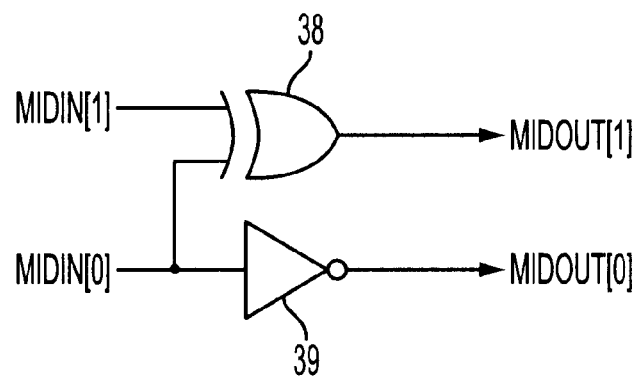
FIG. 16 is a circuit diagram showing an arrangement of the macro ID generation circuit in FIG. 15.

FIG. 16 shows a detailed arrangement of the macro ID generation circuit for realizing the circuits in FIGS. 14A and 15.

This macro ID generation circuit is made up of an Ex-NOR circuit 38 and inverter circuit 39.

In the memory macro 12A, MIDIN[0] ="0", MIDIN[1]= "0", MIDOUT[0]="1", and MIDOUT[1]="0". In the memory macro 12B, MIDIN[0]="1", MIDIN[1]="0", MIDOUT[0]="0", and MIDOUT[1]="1". In the memory macro 12C, MIDIN[0]="0", MIDIN[1]="1", MIDOUT[0]= "1", and MIDOUT[1]="1".

According to the layouts shown in FIGS. 14A, 15, and 16, the circuit layout of the macro ID generation circuit 37 is simple and common to all the memory macros 12A, 12B, 12C, and 12D. In designing a memory-embedded LSI having a plurality of memory macros, the test control blocks 15A, 15B, 15C, and 15D need not to be redesigned, which can contribute to a short design time.

Errors (interconnection errors and the like) in assigning macro IDs to the memory macros 12A, 12B, 12C, and 12D can be reduced to improve the reliability.

Figure 17A:
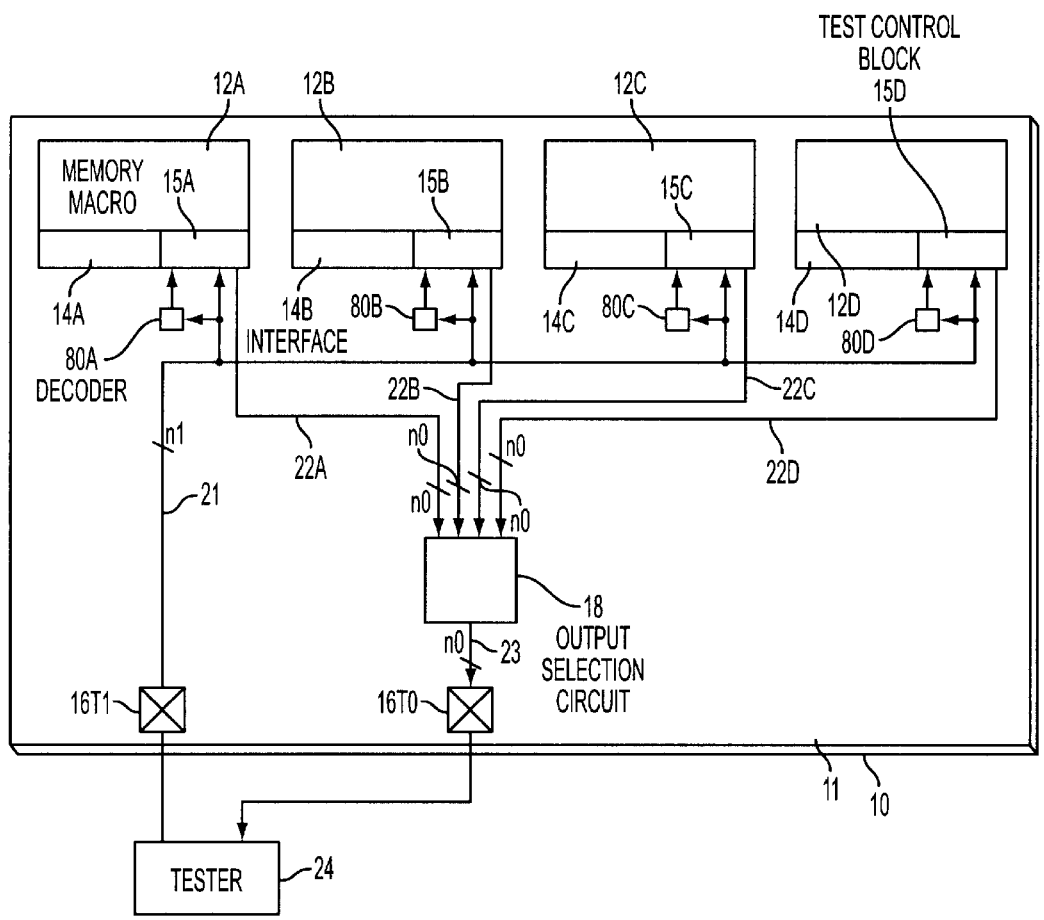
FIGS. 17A and 17B are circuit diagrams, respectively, showing a modification of the test circuit in FIG. 9.

FIG. 14B shows another arrangement in which the macro ID generation circuits 37 in FIG. 15 are formed outside the memory macros 12A, 12B, 12C, and 12D. Even when the macro ID generation circuits 37 are formed outside the memory macros, the test control blocks 15A, 15B, 15C, and 15D of the memory macros 12A, 12B, 12C, and 12D can have the same circuit layout to contribute to a short design time. In addition, errors (interconnection errors and the like) in assigning macro IDS to the memory macros 12A, 12B, 12C, and 12D can be reduced FIG. 17A shows a modification of the memory macro test circuit of the memory-embedded LSI in FIG. 9.

The test circuit of this modification is different from that in FIG. 9 in that the macro selection circuit is formed outside the memory macro. That is, in this modification, both circuits corresponding to the macro ID generation circuit and macro selection circuit in FIG. 9 are formed outside the memory macro.

The test circuit of the modification does not compare the macro ID and input ID in selecting the memory macros 12A, 12B, 12C, and 12D. The test circuit of this modification comprises decoders 80A, 80B, 80C, and 80D arranged outside the memory macros 12A, 12B, 12C, and 12D. The decoders 80A, 80B, 80C, and 80D decode macro address signal bits MA0 and MA1 to select the memory macros 12A, 12B, 12C, and 12D.

Figure 17B:
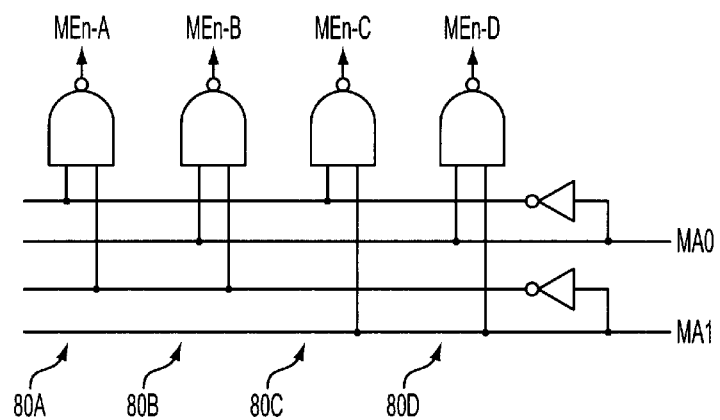

In this case, the decoders 80A, 80B, 80C, and 80D, and particularly their interconnections (FIG. 17B) have different layouts. Hence, by arranging the decoders 80A, 80B, 80C, and 80D outside the memory macros 12A, 12B, 12C, and 12D, the test control blocks 15A, 15B, 15C, and 15D in the memory macros 12A, 12B, 12C, and 12D can have the same layout between all the memory macros 12A, 12B, 12C, and 12D to contribute to a simple memory macro design.

Note that the AND circuits (corresponding to the macro selection circuits) of the decoders 80A, 80B, 80C, and 80D may be arranged inside the memory macros 12A, 12B, 12C, and 12D, and the interconnections (corresponding to the macro ID generation circuits) may be arranged outside the memory macros 12A, 12B, 12C, and 12D.

Figure 18:
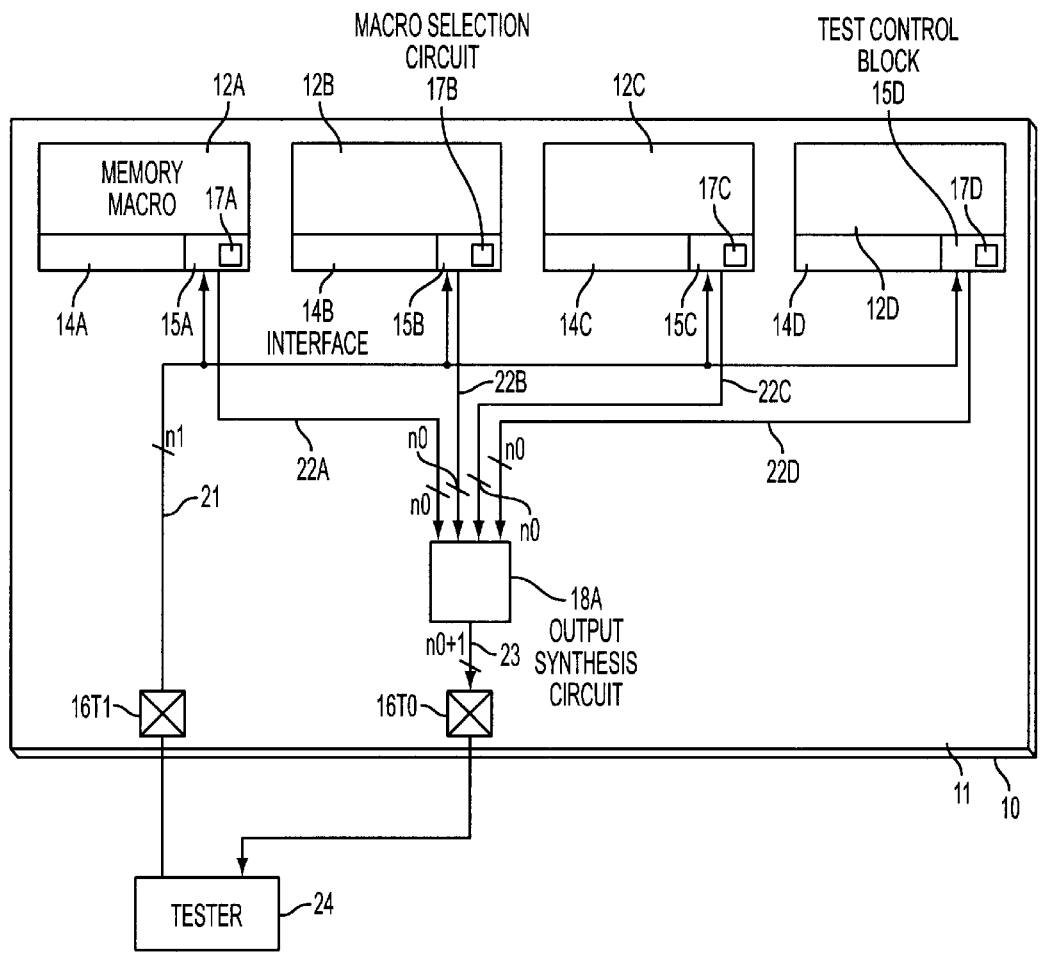
FIG. 18 is a circuit diagram showing the sixth embodiment of the memory macro test circuit.

FIG. 18 shows the sixth embodiment of the memory macro test circuit of the memory-embedded LSI in FIG. 1.

The test circuit of the sixth embodiment is characterized in that all the memory macros are simultaneously selected, and a predetermined logic circuit can be used for an output synthesis circuit 18A to output a PASS/FAIL bit representing a memory macro nondefective or defective, in addition to a normal nO-bit (e.g., 8-bit) output signal (readout data).

In the above-described embodiments, a plurality of memory macros are sequentially selected one by one. In the sixth embodiment, all the memory macros are simultaneously selected and tested. The test circuit of this embodiment can greatly shorten the test time to contribute to a low manufacturing cost.

The layout of the test circuit in the sixth embodiment will be described.

Four memory macros 12A, 12B, 12C, and 12D are laid out on a semiconductor chip 10. The memory macros 12A, 12B, 12C, and 12D respectively comprise interfaces 14A, 14B, 14C, and 14D for inputting/outputting data, and test control blocks 15A, 15B, 15C, and 15D for controlling a memory macro test.

The test control blocks 15A, 15B, 15C, and 15D comprise means for simultaneously selecting all the memory macros 12A, 12B, 12C, and 12D. For example, the test control blocks 15A, 15B, 15C, and 15D incorporate macro selection circuits 17A, 17B, 17C, and 17D having a layout as shown in FIG. 11. If an all-macro selection signal MSELALLp in FIG. 11 is set to "1", all the memory macros 12A, 12B, 12C, and 12D can be simultaneously selected.

In this case, only one memory macro can also be selected in accordance with a macro ID.

A logic section 11 has an input signal line 21 capable of transferring, e.g., nI-bit data, first output signal lines 22A, 22B, 22C, and 22D each capable of transferring no-bit data, a second output signal line 23 capable of transferring nO-bit data, and the output synthesis circuit 18A.

One end of the input signal line 21 is connected to a pad 16TI, and the other end is commonly connected to the memory macros 12A, 12B, 12C, and 12D. One end of each of the first output signal lines 22A, 22B, 22C, and 22D is connected to a corresponding one of the memory macros 12A, 12B, 12C, and 12D, and the other end is connected to the output synthesis circuit 18A. One end of the second output signal line 23 is connected to the output synthesis circuit 18A, and the other end is connected to a pad 16TO.

In general, the pads 16TI and 16TO are used to test the memory macros 12A, 12B, 12C, and 12D and to input/ output data or control signal to/from the circuit of the logic section 11 under limitations on the number of pads formed on the pad section.

Note that the interface 14A can use a circuit having a layout as shown in FIGS. 7 and 8.

FIG. 19 shows an arrangement of the output synthesis circuit 18A in FIG. 18.

Reference symbols DTDO·0-[A], . . . , DTDO·7-[A] denote output signal bits from the memory macro 12A; DTDO·0-[B], . . . , DTDO·7-[B], output signal bits from the memory macro 12B; DTDO·0-[C], . . . , DTDO·7-[C], output signal bits from the memory macro 12C; and DTDO·0-[D], . . . , DTDO·7-[D], output signal bits from the memory macro 12D.

The output signals DTDO·i-[A], DTDO·i-[B], DTDO·i-[C], and DTDO·i-[D] from the respective memory macros are input to an AND circuit 51-i which outputs an output signal DTDO·i (i=0, . . . , 7).

The output signals DTDO·i-[A], DTDO·i-[B], DTDO·i-[C], and DTDO·i-[D] from the respective memory macros are input to a comparator 52-i, and an output signal from the comparator 52-i is input to an AND circuit 53. The AND circuit 53 outputs a PASS/FAIL bit DTDO·8 representing a memory macro nondefective or defective (i=0, . . . , 7).

FIG. 20 shows an arrangement of the comparators 52-0, . . . , 52-7 in FIG. 19.

The output signals DTDO·i-[A], DTDO·i-[B], DTDO·i-[C], and DTDO·i-[D] from the respective memory macros are input to a NAND circuit 54 and OR circuit 55 (i=0, . . . , 7). Output signals from the NAND circuit 54 and OR circuit 55 are input to a NAND circuit 56, and an output signal from the NAND circuit 56 is input to the AND circuit 53 in FIG. 19.

This comparator sets an output signal OUT to "1" when all the output signals DTDO·i-[A], DTDO·i-[B], DTDO·i-[C], and DTDO·i-[D] from the respective memory macros are the same data "0" or "1", and sets the output signal OUT to "0" when all the output signals DTDO·i-[A], DTDO·i-[B], DTDO·i-[C], and DTDO·i-[D] from the respective memory macros are not the same data.

A test method for the memory macro in FIGS. 18 to 20 will be explained.

In the sixth embodiment, all the memory macros 12A, 12B, 12C, and 12D are simultaneously selected, and the same data is written in all the memory macros 12A, 12B, 12C, and 12D.

The all-macro selection signal MSELALLp changes to "1", and output signals MEn from the macro selection circuits in all the memory macros 12A, 12B, 12C, and 12D change to "0". Thus, all the memory macros 12A, 12B, 12C, and 12D are selected and can receive a command.

The same data is written in the memory cells of all the memory macros 12A, 12B, 12C, and 12D, and then data is read out from the memory cells. For example, in a memory macro having 256 I/Os, 256 data are simultaneously read out. In the sixth embodiment, the 256 data are divisionally read out every 8 bits (nO bits) by 32 operations.

Data bits DTDO·0-[A], . . . , DTDO·7-[A], DTDO·0-[B], . . . , DTDO·7-[B], DTDO·0-[C], . . . , DTDO·7-[C], and DTDO·0-[D], . . . , DTDO·7-[D] read out from the memory macros 12A, 12B, 12C, and 12D are input to the output synthesis circuit 18A.

The output synthesis circuit 18A synthesizes the data read out from the memory macros 12A, 12B, 12C, and 12D.

If the memory macros 12A, 12B, 12C, and 12D are nondefective, the data DTDO·i-[A], DTDO·i-[B], DTDO·i-[C], and DTDO·i-[D] read out from the memory macros 12A, 12B, 12C, and 12D have the same value.

Hence, when all the data DTDO·i-[A], DTDO·i-[B], DTDO·i-[C], and DTDO·i-[D] read out from the memory macros 12A, 12B, 12C, and 12D are "1", an output signal from the AND circuit 51-i is also "1"; when all the data DTDO·i-[A], DTDO·i-[B], DTDO·i-[C], and DTDO·i-[D] read out from the memory macros 12A, 12B, 12C, and 12D are "0", an output signal from the AND circuit 51-i is also "0".

In other words, the data DTDO·i-[A], DTDO·i-[B], DTDO·i-[C], and DTDO·i-[D] read out from the memory macros 12A, 12B, 12C, and 12D are directly read out as output signal bits DTDO·0, . . . , DTDO·7 to a tester 24 outside the semiconductor chip 10.

At this time, output signals from all the comparators 52-0, . . . , 52-7 are "1", and an output signal from the AND circuit 53, i.e., the PASS/FAIL bit DTDO·8 is "1".

If one of the memory macros 12A, 12B, 12C, and 12D is defective, the data DTDO·i-[A], DTDO·i-[B], DTDO·i-[C], and DTDO·i-[D] read out from the memory macros 12A, 12B, 12C, and 12D do not have the same value. In this case, an output signal from the AND circuit 51-i is always "0".

However, whether all the readout data DTDO·i-[A], DTDO·i-[B], DTDO·i-[C], and DTDO·i-[D] have the same value cannot be determined by only the AND circuit 51-i.

For this reason, the PASS/FAIL bit DTDO·8 is used to determine whether all the readout data from the memory macros 12A, 12B, 12C, and 12D coincide with each other.

More specifically, when the PASS/FAIL bit DTDO·8 is "0", all the data DTDO·i-[A], DTDO·i-[B], DTDO·i-[C], and DTDO·i-[D] read out from the memory macros 12A, 12B, 12C, and 12D do not have the same value. In this case, any of the memory macros 12A, 12B, 12C, and 12D is defective.

When the PASS/FAIL bit DTDO·8 is "1", all the data DTDO·i-[A], DTDO·i-[B], DTDO·i-[C], and DTDO·i-[D] read out from the memory macros 12A, 12B, 12C, and 12D have the same value. In this case, all the memory macros 12A, 12B, 12C, and 12D are defective or nondefective. Whether the memory macros 12A, 12B, 12C, and 12D are defective is determined by comparing the data DTDO·i-[A], DTDO·i-[B], DTDO·i-[C], and DTDO·i-[D] read out from the memory macros 12A, 12B, 12C, and 12D with an expected value by, e.g., the tester.

The memory macro test circuit having this layout can simultaneously test a plurality of memory macros to greatly shorten the test time. Further, the test circuit can determine by the PASS/FAIL bit DTDO·8 whether the readout data of the respective memory macros coincide with each other. If all the readout data of the respective memory macros do not coincide with each other, the PASS/FAIL bit DTDO·8 is "0"; if all the readout data of the respective memory macros coincide with each other, the PASS/FAIL bit DTDO·8 is "1".

When the PASS/FAIL bit DTDO·8 is "1", output signals from the respective memory macros coincide with each other, but whether these output signals coincide with an expected value cannot be determined. Thus, the tester 24 compares the output signal bits DTDO·0, . . . , DTDO·7 with the expected value to determine whether the memory macro has a defective memory cell.

When the PASS/FAIL bit DTDO·8 is "0", output signals from the respective memory macros do not coincide with each other, and defective memory cells exist in any of the four memory macros. However, which of the four memory macros 12A, 12B, 12C, and 12D has defectives cannot be specified because the output signal bits DTDO·0, . . . , DTDO·7 are compressed for the four memory macros. To specify any of the memory macros 12A, 12B, 12C, and 12D containing defectives, these memory macros must be individually tested.

The test circuit of the sixth embodiment is, therefore, effectively applied to a final test for a memory-embedded LSI expected to exhibit nondefective (PASS) in almost all the test results. In the final test, whether the memory cell is a nondefective (shipping enable) or defective (shipping disable) is only determined, and a defective cell is not replaced unlike a wafer state test. From this viewpoint, the test circuit of the sixth embodiment is preferably applied to the final test.

In the sixth embodiment, the PASS/FAIL bit DTDO·8 is "0" when all the readout data of the respective memory macros do not coincide with each other, and "1" when all the readout data of the respective memory macros coincide with each other. Alternatively, the output synthesis circuit 18A may be changed, and the PASS/FAIL bit DTDO·8 may be "1" when all the readout data of the respective memory macros do not coincide with each other, and "0" when all the readout data of the respective memory macros coincide with each other.

Figure 21:
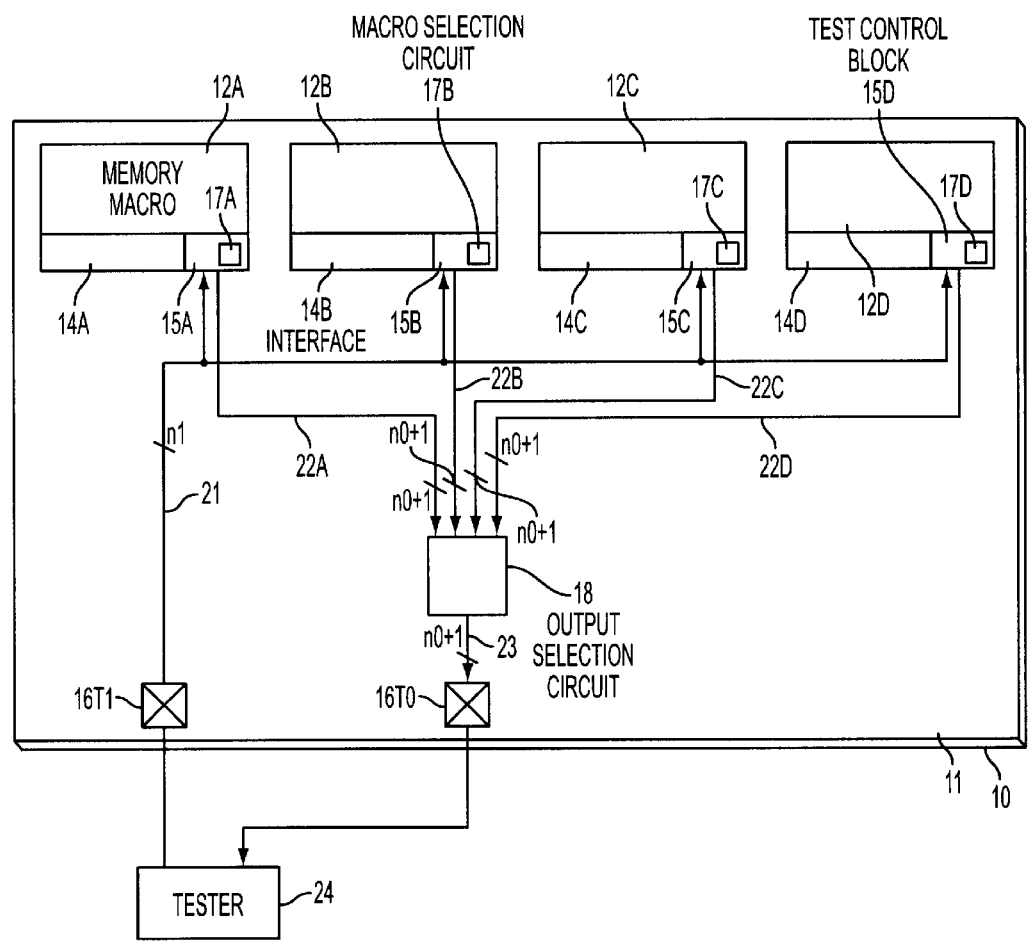
FIG. 21 is a circuit diagram showing the seventh embodiment of the memory macro test circuit.

FIG. 21 shows the seventh embodiment of the memory macro test circuit of the memory-embedded LSI in FIG. 1.

According to the test circuit of the seventh embodiment, for example, simultaneously readout 256-bit data can be divisionally read out every 8 bits by 32 operations in a selected memory macro. Further, (8×j)-bit data can be compressed to 8-bit data and divisionally read out by several operations, and a maximum of 256-bit data can be compressed into 8-bit data and read out at once.

The test circuit of this embodiment can be used by itself. If this test circuit is used in combination with, e.g., the test circuit in FIGS. 18 to 20 capable of selecting all the macros, all the memory macros can be tested within a very short time to effectively reduce the manufacturing cost.

The layout of the test circuit in the seventh embodiment will be described.

Four memory macros 12A, 12B, 12C, and 12D are laid out on a semiconductor chip 10. The memory macros 12A, 12B, 12C, and 12D respectively comprise interfaces 14A, 14B, 14C, and 14D for inputting/outputting data, and test control blocks 15A, 15B, 15C, and 15D for controlling a memory macro test.

The test control blocks 15A, 15B, 15C, and 15D comprise macro ID generation circuits and macro selection circuits 17A, 17B, 17C, and 17D. The macro selection circuits 17A, 17B, 17C, and 17D may have a layout as shown in FIG. 11, and may be equipped with means for simultaneously selecting all the memory macros 12A, 12B, 12C, and 12D.

A logic section 11 has an input signal line 21 capable of transferring, e.g., nI-bit data, first output signal lines 22A, 22B, 22C, and 22D each capable of transferring (nO+1)-bit data, second output signal line 23 capable of transferring (nO+1)-bit data, and output selection circuit 18.

One end of the input signal line 21 is connected to a pad 16TI, and the other end is commonly connected to the memory macros 12A, 12B, 12C, and 12D. One end of each of the first output signal lines 22A, 22B, 22C, and 22D is connected to a corresponding one of the memory macros 12A, 12B, 12C, and 12D, and the other end is connected to the output selection circuit 18. One end of the second output signal line 23 is connected to the output selection circuit 18, and the other end is connected to a pad 16TO.

In general, the pads 16TI and 16TO are used to test the memory macros 12A, 12B, 12C, and 12D and to input/output data or control signal to/from the circuit of the logic section 11 under limitations on the number of pads formed on the pad section.

Figure 22:
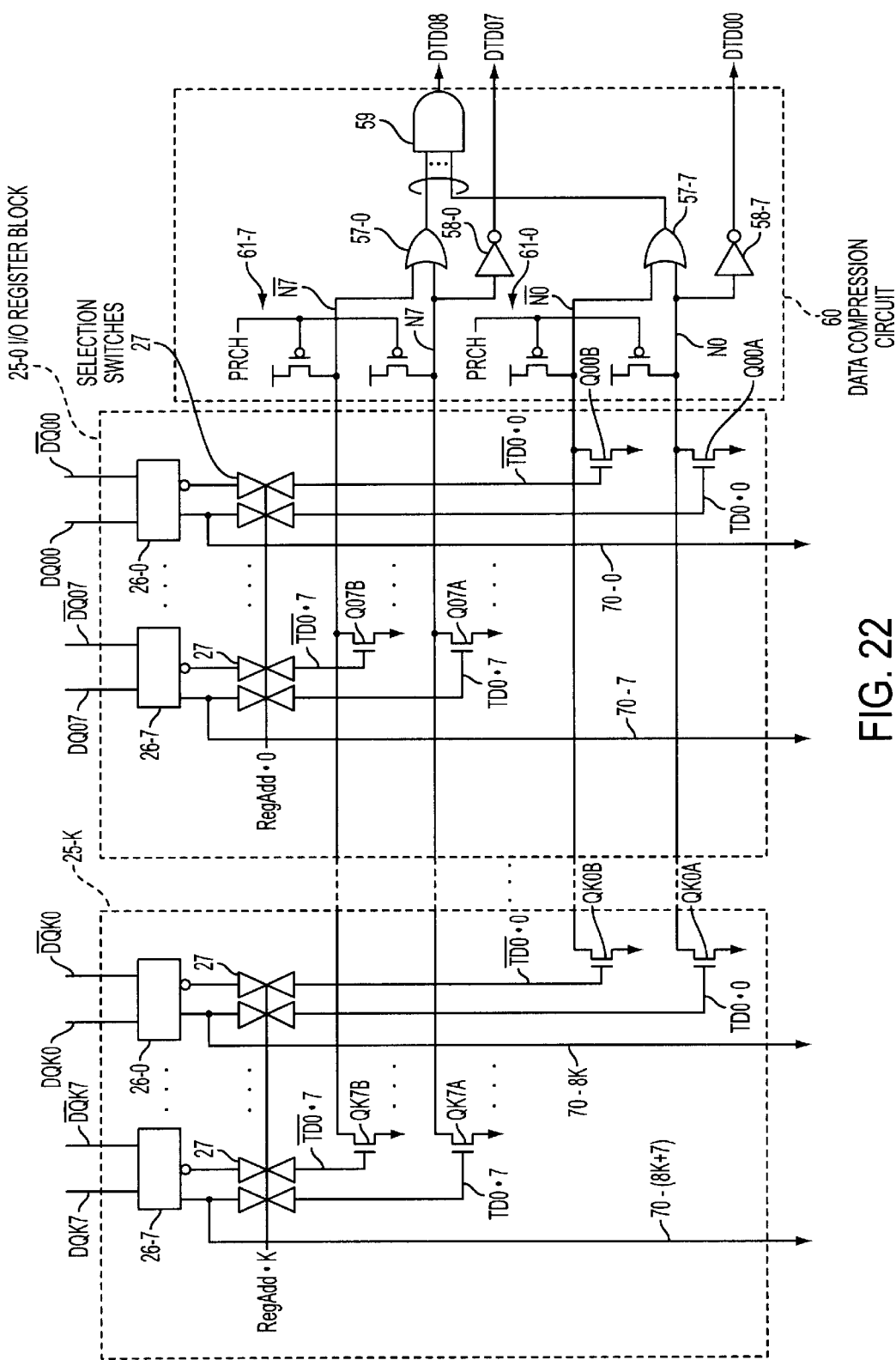
FIG. 22 is a circuit diagram showing an arrangement of an interface in FIG. 21.

FIG. 22 shows an arrangement of the interface 14 in each of the memory macros 12A, 12B, 12C, and 12D in FIG. 21.

In the seventh embodiment, an input register, input signal line, and test signal line are omitted for illustrative convenience and descriptive convenience. In practice, these components have a layout as shown in FIG. 7.

The interface 14A of the seventh embodiment is characterized by a data compression circuit 60 capable of compressing (8×j)-bit data ($1 \leq j \leq K+1$) read out from at least one or all of {K (e.g., 31)+1} I/O register blocks 25-0, . . . , 25-K, and generating a PASS/FAIL bit representing whether readout data is coincidence.

The memory macro has the (K+1) I/O register blocks 25-0, . . . , 25-K. Each of the I/O register blocks 25-0, . . . , 25-K has, e.g., eight output registers 26-0, . . . , 26-7 and selection switches 27. A terminal of each output register 26-i (i=0, . . . , 7) on the memory macro side is connected to a pair of data lines DQKi and $\overline{DQKi}$ (i=0, . . . , 7).

For example, in the I/O register block 25-K, a terminal of the output register 26-i (i=0, . . . , 7) on the logic section side is connected to a noninverting output terminal and inverting output terminal. The noninverting output terminal is connected to an output signal line 70-i (i=8K, . . . , 8K+7). The noninverting output terminal and inverting output terminal are connected to the data compression circuit 60 via the selection switch 27.

The selection switch 27 is arbitrarily ON/OFF-controlled in units of I/O register blocks by register address signals RegAdd·0, . . . , RegAdd·K. For example, in the seventh embodiment, the selection switches 27 in all the I/O register blocks 25-0, . . . , 25-K can be turned on.

For example, in the I/O register block 25-0, readout data TDOi and $\overline{TDOi}$ output from the output register 26-i are input to the gates of n-channel MOS transistors Q0iA and Q0iB (i=0, . . . , 7). In the I/O register block 25-K, readout data TDOi and TDOI output from the output register 26-i are input to the gates of n-channel MOS transistors QKiA and QKiB (i=0, . . . , 7).

The drains of the MOS transistors Q0iA, . . . , QKiA connected to the noninverting output terminals of the output registers 26-i in the I/O register blocks 25-0, . . . , 25-K are commonly connected to a node Ni. The drains of the MOS transistors Q0iB, . . . , QKiB connected to the inverting output terminals of the output registers 26-i in the I/O register blocks 25-0, . . . , 25-K are commonly connected to a node $\overline{Ni}$. The sources of the respective MOS transistors are grounded.

Precharge p-channel MOS transistors 61-0, . . . , 61-7 precharge the nodes Ni and $\overline{Ni}$ to, e.g., a power supply potential ("1") VDD. The gates of the precharge p-channel MOS transistors 61-0, . . . , 61-7 receive a precharge signal PRCH. In the seventh embodiment, e.g., the node is precharged in the second half of a clock used for the memory macro, and data is read out in the first half.

Reference numeral 57-i (i=0, 1, . . . , 7) denotes an OR circuit having input terminals Ni and /Ni; and 58-i (i=0, 1, . . . , 7), an inverter which has an input terminal Ni and outputs the output signal bit DTDO·i outside the memory macro. All outputs from the OR circuits 57-i (i=0, 1, . . . , 7) are input to an AND circuit 59. The output signal bit DTDO·8 from the AND circuit 59 is output outside the memory macro.

If no data is compressed, the register address signals RegAdd·0, . . . , RegAdd·K are generated in the test control block, and select one of the K I/O register blocks 25-0, . . . , 25-K. A selection switch 27 is turned on in the selected I/O register block, and a selection switch 27 is turned off in the unselected I/O register block.

Then, 8-bit complementary data, TDO·0, $\overline{TDO}$·0, . . . , TDO·7, $\overline{TDO}$·7 are guided from the selected I/O register block to the data compression circuit 60. The data compression circuit 60 outputs the eight data bits TDO·0, ..., TDO·7 as output signal bits DTDO·0, DTDO·7.

For example, the I/O register block 25-K is selected to turn on and off one and the other one of each of the MOS transistors QkiA and QkiB connected to the noninverting output terminal and inverting output terminal of the output register 26-i in the I/O register block 25-K.

Accordingly, all the output signals from OR circuits 57-0, ..., 57-7 change to "1", and an output signal from an AND circuit 59, i.e., a PASS/FAIL bit DTDO·8 changes to "1" representing coincidence of data.

By sequentially selecting the (K+1) I/O register blocks 25-0, ..., 25-K one by one, all the (K+1)×8-bit data can be read out from the memory macro outside the semiconductor chip 10.

If data is compressed, at least two or all of the register address signals RegAdd·0, ..., RegAdd·K change to "1" to select at least two or all of the I/O register blocks 25-0, ..., 25-K. A selection switch 27 is turned on in the selected I/O register block, and a selection switch 27 is turned off in the unselected I/O register block.

Then, the 8-bit complementary data, TDO·0, $\overline{\text{TDO}}$·0, ..., TDO·7, $\overline{\text{TDO}}$·7 are guided from the selected I/O register block to the data compression circuit 60 where the data are compressed. The data compression circuit 60 outputs the eight output signal bits DTDO·0, ..., DTDO·7, and at the same time outputs the 1-bit PASS/FAIL bit DTDO·8 representing coincidence/noncoincidence of the readout data.

A test method for the memory macro in FIGS. 21 and 22 will be explained.

An operation of reading out 8-bit data from one selected I/O register block in a selected memory macro will be described.

For example, when the I/O register block 25-K is selected, the register address signal RedAdd·K changes to "1", and the remaining register address signals RedAdd·0, ..., RedAdd·K-1 change to "0". The output registers 26-0, ..., 26-7 in the I/O register block 25-K output the complementary data TDOi and $\overline{\text{TDOi}}$.

Either one of the two MOS transistors QKiA and QKiB in the I/O register block 25-K is turned on, and the other is turned off. One of the two nodes Ni and $\overline{\text{Ni}}$ changes to "1", and the other changes to "0".

When the noninverting output TDOi of the output register 26-i is "1", the node Ni and output signal DTDO·i are "0" and "1", respectively. When the noninverting output TDOi of the output register 26-i is "0", the node Ni and output signal DTDO·i are "1" and "0", respectively. That is, the noninverting output TDOi of the output register 26-i coincide with the output signal DTDO·i.

Since the nodes Ni and $\overline{\text{Ni}}$ always have complementary potentials, all the output signals from the OR circuits 57-0, ..., 57-7 are "1", and an output from the AND circuit 59, i.e., the PASS/FAIL bit DTDO·8 is "1".

An operation of selecting j I/O register blocks in a selected memory macro, compressing (8×j)-bit data read out from these j blocks into 8-bit data, and reading out the 8-bit data will be described.

The selection switches 27 in the j selected I/O register blocks are turned on. Data of the output registers 26-0, ..., 26-7 in the j selected I/O register blocks are input to the gates of the n-channel MOS transistors. Assume that at least the I/O register blocks 25-0 and 25-K are selected.

If no defective memory cell exists, the same data is written in the I/O register blocks 25-0 and 25-K, and data read out from the I/O register blocks 25-0 and 25-K should coincide with each other. For example, data "1" and "0" are respectively output to the noninverting output terminals and inverting output terminals of the output registers 26-i in the I/O register blocks 25-0 and 25-K. In this case, both the MOS transistors Q0iA and QKiA are turned on, and both the MOS transistors Q0iB and QKiB are turned off. Further, data "0" and "1" are respectively output to the noninverting output terminals and inverting output terminals of the output registers 26-i in the I/O register blocks 25-0 and 25-K. In this case, both the MOS transistors Q0iA and QKiA are turned off, and both the MOS transistors Q0iB and QKiB are turned on.

In this manner, if no defective memory cell exists, either one of the nodes Ni and $\overline{\text{Ni}}$ changes to "1", and the other changes to "0". The noninverting output TDO·i from the output register 26-i is output as the output signal DTDO·i. The PASS/FAIL bit DTDO·8 becomes "1" representing that data of the respective I/O register blocks coincide with each other.

If a defective memory cell exists, the same data is written in the I/O register blocks 25-0 and 25-K, but data read out from the I/O register blocks 25-0 and 25-K may not coincide with each other. For example, data "1" and "0" are respectively output to the noninverting output terminal and inverting output terminal of the output register 26-i in the I/O register block 25-0, while data "0" and "1" are respectively output to the noninverting output terminal and inverting output terminal of the output register 26-i in the I/O register block 25-K. In this case, the MOS transistors Q0iA and Q0iB are respectively turned on and off in the I/O register block 25-0, whereas the MOS transistors QKiA and QKiB are respectively turned off and on in the I/O register block 25-K.

Accordingly, if a defective memory cell exists, data read out from the I/O register blocks 25-0 and 25-K may not coincide with each other. At this time, both the nodes Ni and $\overline{\text{Ni}}$ change to "0". The PASS/FAIL bit DTDO·8 changes to "0" representing data of the I/O register blocks do not coincide with each other.

Note that if all the memory cells subjected to a read are defectives, data read out from the I/O register blocks 25-0 and 25-K may coincide with each other, and the PASS/FAIL bit DTDO·8 may be "1". For this reason, when the PASS/FAIL bit DTDO·8 is "1", e.g., the tester compares the readout data with an expected value to determine whether a defective memory cell exists.

As described above, when corresponding readout data in the j selected I/O register blocks coincide with each other, both the nodes Ni and $\overline{\text{Ni}}$ do not change to "0". All the output signals from the OR circuits 57-0, ..., 57-7 change to "1", and the output signal DTDO·8 from the AND circuit 59 also changes to "1".

When corresponding readout data in the j selected I/O register blocks do not coincide with each other, both the nodes Ni and $\overline{\text{Ni}}$ change to "0". All the output signals from the OR circuits 57-0, ..., 57-7 change to "0", and the output signal DTDO·8 from the AND circuit 59 also changes to "0".

According to the memory macro test circuit having the above layout, j (j is a natural number of 2 or more) sets of s-bit ($1 \leq s \leq n$) data are read out in a memory macro having an n-bit noninverting output. These sets of data are synthesized and output. At the same time, the s-bit data are compared between the respective sets to output the PASS/FAIL bit representing whether these sets of s-bit data coincide with each other. Consequently, the test time for one memory macro can be greatly shortened.

When the PASS/FAIL bit DTDO·8 is "1", output signals from the respective I/O register blocks in the memory macro coincide with each other, but whether these output signals coincide with an expected value cannot be determined. Thus, the tester 24 compares the output signal bits DTDO·0, . . . , DTDO·7 with the expected value to determine whether the memory macro contains a defective memory cell.

When the PASS/FAIL bit DTDO·8 is "0", output signals from the respective I/O register blocks in the memory macro do not coincide with each other, and the memory macro contains a defective. However, which of the j selected I/O register blocks contains a defective cannot be specified because the output signal bits DTDO·0, . . . , DTDO·7 are compressed for the j (e.g., all) I/O register blocks. To specify an I/O register block containing a defective, these I/O register blocks must be individually tested.

Since the test circuit of the seventh embodiment selects all the I/O register blocks, e.g., simultaneously readout 256-bit data in the memory macro need not be divisionally read out every 8 bits by 32 operations. The 256-bit data can be compressed into 8-bit data, and the 8-bit data can be read out at once.

In other words, since the I/O register blocks need not be sequentially selected one by one, the test time can be greatly shortened.

The test circuit of this embodiment can be used by itself. If this test circuit is used in combination with, e.g., the test circuit in FIGS. 18 to 20 capable of selecting all the macros, all the memory macros can be tested within a very short time to effectively reduce the manufacturing cost.

Figure 23:
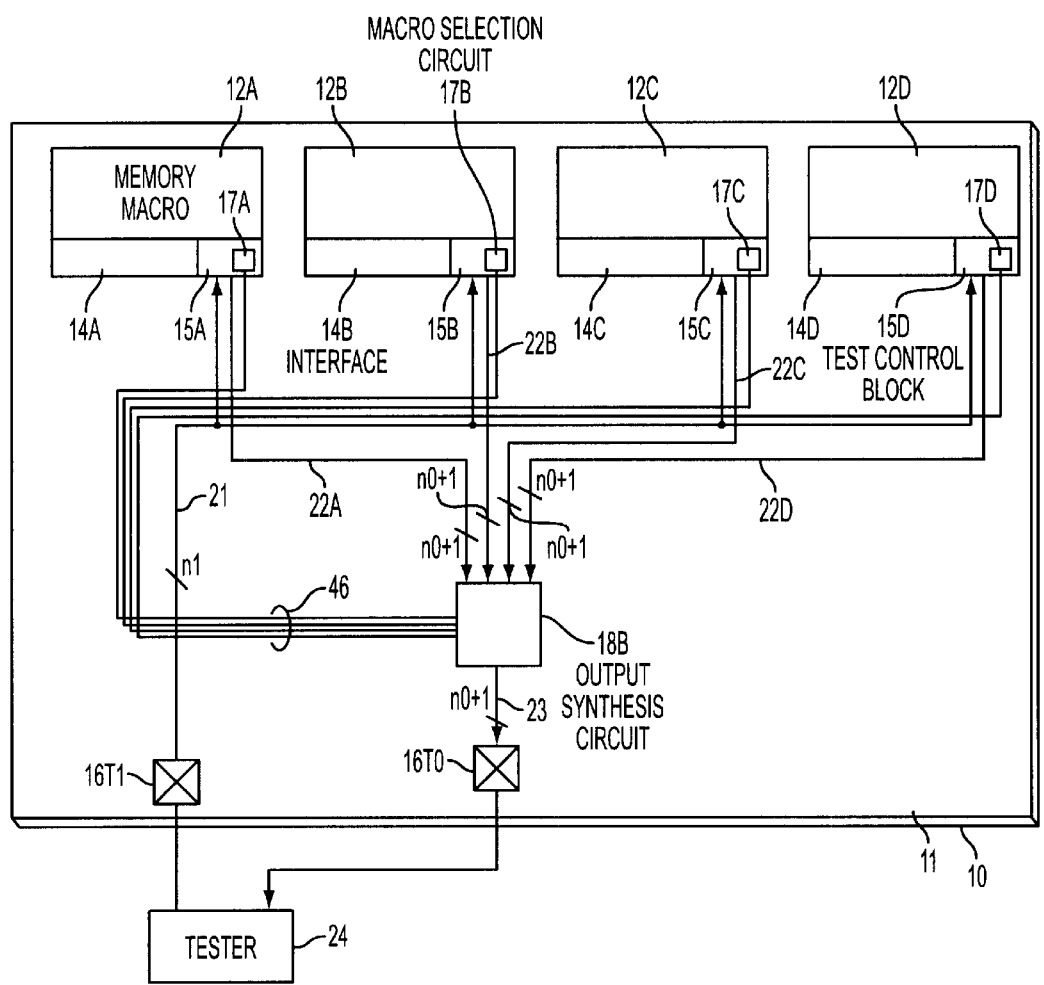
FIG. 23 is a circuit diagram showing the eighth embodiment of the memory macro test circuit.

FIG. 23 shows the eighth embodiment of the memory macro test circuit of the memory-embedded LSI in FIG. 1.

The test circuit of the eighth embodiment is characterized by a combination of an arrangement of collecting data output from all the macros shown in FIGS. 18 to 20, and an arrangement of collecting data from all the I/O register blocks in one macro shown in FIGS. 21 and 22. The test circuit of this embodiment can test all the memory macros within a very short time to effectively reduce the manufacturing cost.

Four memory macros 12A, 12B, 12C, and 12D are laid out on a semiconductor chip 10. The memory macros 12A, 12B, 12C, and 12D respectively comprise interfaces 14A, 14B, 14C, and 14D for inputting/outputting data, and test control blocks 15A, 15B, 15C, and 15D for controlling a memory macro test.

The test control blocks 15A, 15B, 15C, and 15D comprise macro ID generation circuits for generating macro IDs for identifying the memory macros, and macro selection circuits 17A, 17B, 17C, and 17D for comparing the macro IDs with a macro selection signal (input ID) input externally from the semiconductor chip 10 to the memory macros, and selecting a memory macro.

The macro ID generation circuit may be arranged inside the memory macro (test control block), like the arrangement shown in FIGS. 6 and 14A, or outside the memory macro, like the arrangement shown in FIGS. 9, 10, 13, and 14B. The macro selection circuit preferably has, e.g., a layout shown in FIG. 12, i.e., a layout capable of selecting an arbitrary number of memory macros from the memory macros 12A, 12B, 12C, and 12D.

A logic section 11 has an input signal line 21 capable of transferring, e.g., nI-bit data, first output signal lines 22A, 22B, 22C, and 22D each capable of transferring (nO+1)-bit data, second output signal line 23 capable of transferring (nO+1)-bit data, control signal lines 46, and output synthesis circuit 18B.

One end of the input signal line 21 is connected to a pad 16TI, and the other end is commonly connected to the memory macros 12A, 12B, 12C, and 12D. One end of each of the first output signal lines 22A, 22B, 22C, and 22D is connected to a corresponding one of the memory macros 12A, 12B, 12C, and 12D, and the other end is connected to the output synthesis circuit 18B. One end of the second output signal line 23 is connected to the output synthesis circuit 18B, and the other end is connected to a pad 16TO.

One end of each control signal line 46 is connected to a corresponding one of the memory macros 12A, 12B, 12C, and 12D, and the other end is connected to the output synthesis circuit 18B. The output synthesis circuit 18B selects the first output signal lines 22A, 22B, 22C, and 22D based on control signals MEn-[A], MEn-[B], MEn-[C], and MEn-[D] output from the memory macros 12A, 12B, 12C, and 12D, and synthesizes data from a selected output signal line, i.e., a selected memory macro.

In general, the pads 16TI and 16TO are used to test the memory macros 12A, 12B, 12C, and 12D and to input/output data or control signal to/from the circuit of the logic section 11 under limitations on the number of pads formed on the pad section.

Note that the interfaces 14A, 14B, 14C, and 14D of the memory macros 12A, 12B, 12C, and 12D have a layout as shown in FIG. 22, i.e., a layout capable of selecting K I/O register blocks individually or by a plurality (particularly all) of blocks at once, and synthesizing data of the selected I/O register blocks.

The signals MEn-[A], MEn-[B], MEn-[C], and MEn-[D] output from the macro selection circuits 17A, 17B, 17C, and 17D of the memory macros 12A, 12B, 12C, and 12D are used as control signals for the output synthesis circuit 18B.

Figure 24:
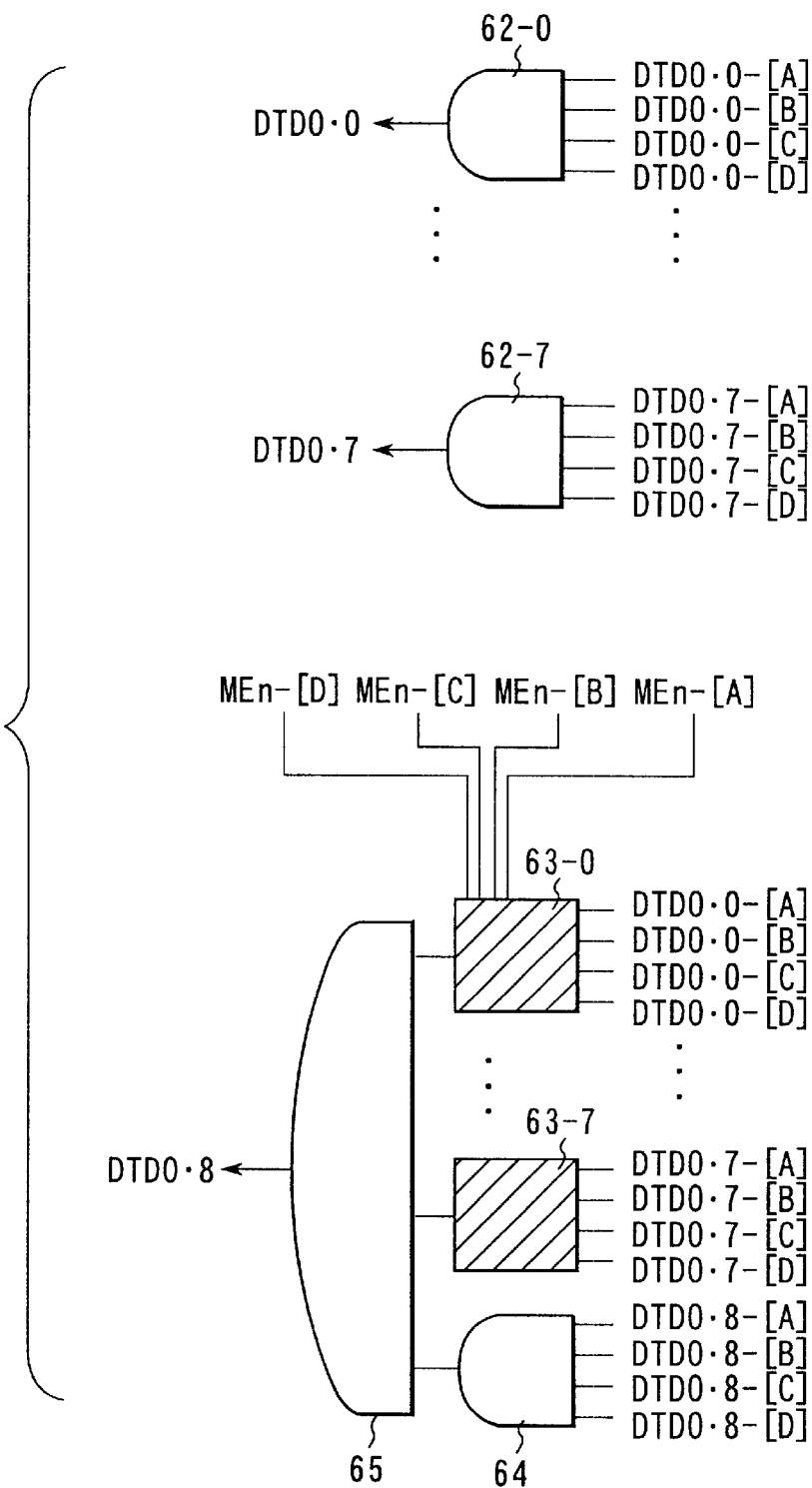
FIG. 24 is a circuit diagram showing an arrangement of an output synthesis circuit in FIG. 23.

FIG. 24 shows an arrangement of the output synthesis circuit 18B in FIG. 23.

Reference symbols DTDO·0-[A], . . . , DTDO·7-[A] denote readout data bits output from the memory macro 12A; DTDO·0-[B], . . . , DTDO·7-[B], readout data bits output from the memory macro 12B; DTDO·0-[C], . . . , DTDO·7-[C], readout data bits output from the memory macro 12C; and DTDO·0-[D], . . . , DTDO·7-[D], readout data bits output from the memory macro 12D.

The readout data DTDO·i-[A], DTDO·i-[B], DTDO·i-[C], and DTDO·i-[D] from the respective memory macros are input to an AND circuit 62-i which outputs synthesized readout data DTDO·i (i=0, . . . , 7).

The readout data DTDO·i-[A], DTDO·i-[B], DTDO·i-[C], and DTDO·i-[D] from the respective memory macros are also input to a comparator 63-i. An output signal from the comparator 63-i is input to an AND circuit 65. The comparator 63-i outputs a signal representing whether the readout data DTDO·i-[A], DTDO·i-[B], DTDO·i-[C], and DTDO·i-[D] coincide with each other or do not coincide with each other.

DTDO·8-[A], DTDO·8-[B], DTDO·8-[C], and DTDO·8-[D] correspond to PASS/FAIL bits output from the interfaces (FIG. 21) in the memory macros 12A, 12B, 12C, and 12D. An output from the AND circuit 65 can become "1" only when the PASS/FAIL bits of the memory macros 12A, 12B, 12C, and 12D are "1" (coincidence).

More specifically, in the eighth embodiment, only when readout data of selected I/O register blocks in a selected memory macro coincide with each other, and readout data of selected memory macros also coincide with each other, the output signal (PASS/FAIL bit) DTDO·8 from the AND circuit 65 is "1".

MEn-[A], MEn-[B], MEn-[C], and MEn-[D] are output signals from the macro selection circuits (FIG. 7) of the memory macros 12A, 12B, 12C, and 12D. MEn-[A], MEn-[B], MEn-[C], and MEn-[D] are "0" when the memory macros are selected, and "1" when no memory macros are selected.

Figure 25:
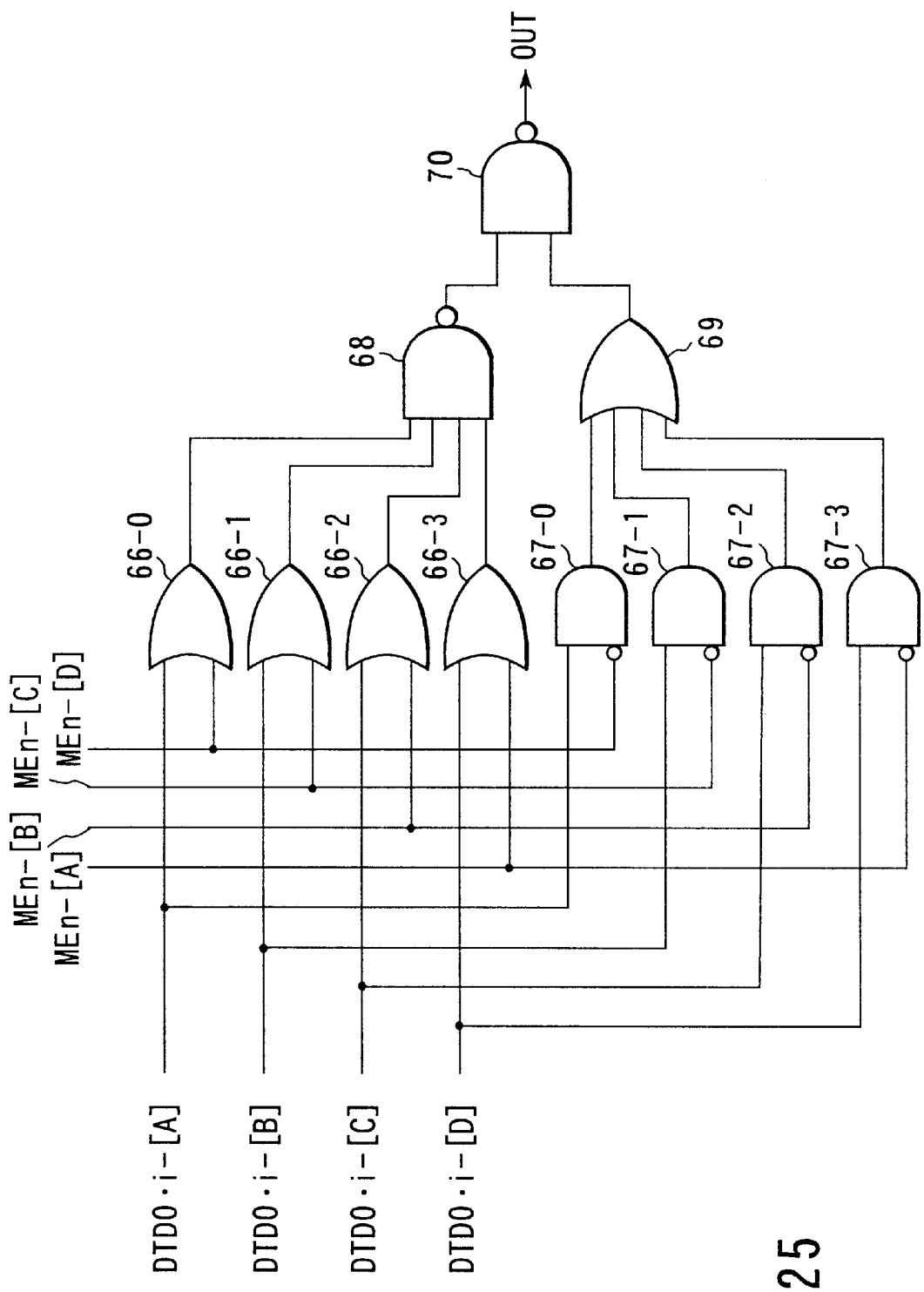
FIG. 25 is a circuit diagram showing an arrangement of a comparator in FIG. 24.

FIG. 25 shows an arrangement of the comparators 63-0, . . . , 63-7 in FIG. 24.

The output signals DTDO·i-[A], DTDO·i-[B], DTDO·i-[C], and DTDO·i-[D] from the respective memory macros are input to OR circuits 66-0, . . . , 66-3 and AND circuits 67-0, . . . , 67-3 (i=0, . . . , 7). Output signals from the OR circuits 66-0, . . . , 66-3 are input to a NAND circuit 68, and an output signal from the NAND circuit 68 is input to a NAND circuit 70. Output signals from the AND circuits 67-0, . . . , 67-3 are input to an OR circuit 69, and an output signal from the OR circuit 69 is input to the NAND circuit 70. An output signal from the NAND circuit 70 is input to the AND circuit 65 in FIG. 24.

This comparator sets an output signal OUT to "1" when all the output signals DTDO·i-[A], DTDO·i-[B], DTDO·i-[C], and DTDO·i-[D] from selected memory macros are the same data "0" or "1", and sets the output signal OUT to "0" when all the output signals DTDO·i-[A], DTDO·i-[B], DTDO·i-[C], and DTDO·i-[D] from selected memory macros are not the same data.

Selection/non-selection of the memory macro is determined from the control signals MEn-[A], MEn-[B], MEn-[C], and MEn-[D] output from the macro selection circuits (FIG. 11) of the memory macros 12A, 12B, 12C, and 12D.

For example, when the memory macros 12A, 12B, and 12D are selected, and the memory macro 12C is not selected, MEn-[A], MEn-[B], MEn-[C], and MEn-[D] are "0", "0", "1", and "0", respectively. At this time, output signals from the OR circuit 66-2 and AND circuit 67-2 are always "1" and "0" regardless of readout data from the memory macro 12C.

When the readout data coincide with each other between the macros, and the readout data DTDO·i-[A], DTDO·i-[B], and DTDO·i-[D] are "1", output signals from the OR circuits 66-0, 66-1, and 66-3 are "1", and output signals from the AND circuits 67-0, 67-1, and 67-3 are also "1". Hence, output signals from the NAND circuit 68, OR circuit 69, and NAND circuit 70 are "0", "1", and "1", respectively.

When the readout data coincide with each other between the macros, and the readout data DTDO·i-[A], DTDO·i-[B], and DTDO·i-[D] are "0", output signals from the OR circuits 66-0, 66-1, and 66-3 are "0", and output signals from the AND circuits 67-0, 67-1, and 67-3 are also "0". Consequently, output signals from the NAND circuit 68, OR circuit 69, and NAND circuit 70 are "1", "0", and "1", respectively.

When the readout data do not coincide with each other between the macros, the readout data DTDO·i-[A] and DTDO·i-[B] are "0", and the readout data DTDO·i-[D] is "1", output signals from the OR circuits 66-0 and 66-1 are "0", an output signal from the OR circuit 66-3 is "1", output signals from the AND circuits 67-0 and 67-1 are "0", and an output signal from the AND circuit 67-3 is "1". As a result, output signals from the NAND circuit 68, OR circuit 69, and NAND circuit 70 are "1", "1", and "0", respectively.

A test method for the memory macro in FIGS. 23 to 25 will be explained.

An operation of selecting all the memory macros 12A, 12B, 12C, and 12D and selecting all the I/O register blocks (25-0, . . . , 25-K in FIG. 21) in each memory macro will be described.

For example, when data of the I/O register blocks in the memory macro 12D do not coincide with each other, the PASS/FAIL bit DTDO·8-[D] output from the memory macro 12D is "0". An output signal from the AND circuit 65 in FIG. 23, i.e., the PASS/FAIL bit DTDO·8-[D] is "0" representing data noncoincidence. This also applies to the case in which data of the I/O register blocks in the memory macro 12A, 12B, or 12C do not coincide with each other.

For example, when data of all the I/O register blocks in each of the memory macros 12A, 12B, 12C, and 12D coincide with each other, all the PASS/FAIL bits DTDO·8-[A], DTDO·8-[B], DTDO·8-[C], and DTDO·8-[D] output from the memory macros 12A, 12B, 12C, and 12D are "1".

Since all the memory macros 12A, 12B, 12C, and 12D are selected, all the control signals MEn-[A], MEn-[B], MEn-[C], and MEn-[D] output from the memory macros 12A, 12B, 12C, and 12D are "0".

If the readout data coincide with each other between the macros, all the output signals from the comparators 63-0, . . . , 63-7 in FIG. 24 are "1". Therefore, an output signal from the AND circuit 65 in FIG. 24, i.e., the PASS/FAIL bit DTDO·8 is "1" representing data coincidence.

If the readout data do not coincide with each other between the macros, all the output signals from the comparators 63-0, . . . , 63-7 in FIG. 24 are not "1". An output signal from the AND circuit 65 in FIG. 24, i.e., the PASS/FAIL bit DTDO·8 is "0" representing data noncoincidence.

The eighth embodiment cannot determine a memory macro and I/O register block from which erroneous data is read out when the PASS/FAIL bit DTDO·8 is "0". To specify a defective cell, the memory macros and I/O register blocks must be individually tested. In other words, the present invention is very effective for a final test in which almost all the cells are determined as nondefectives, and a defective cell need not be specified.

The readout data DTDO·i-[A], DTDO·i-[B], DTDO·i-[C], and DTDO·i-[D] output from the memory macros 12A, 12B, 12C, and 12D are synthesized by the AND circuits 62-0, . . . , 62-7, and read out as 8-bit collected readout data DTDO·0, . . . , DTDO·7 of all the memory macros outside the semiconductor chip 10.

The data read outside the semiconductor chip 10 are compared with an expected value by the tester 24 to determine nondefective or defective memory cells.

Figure 26:
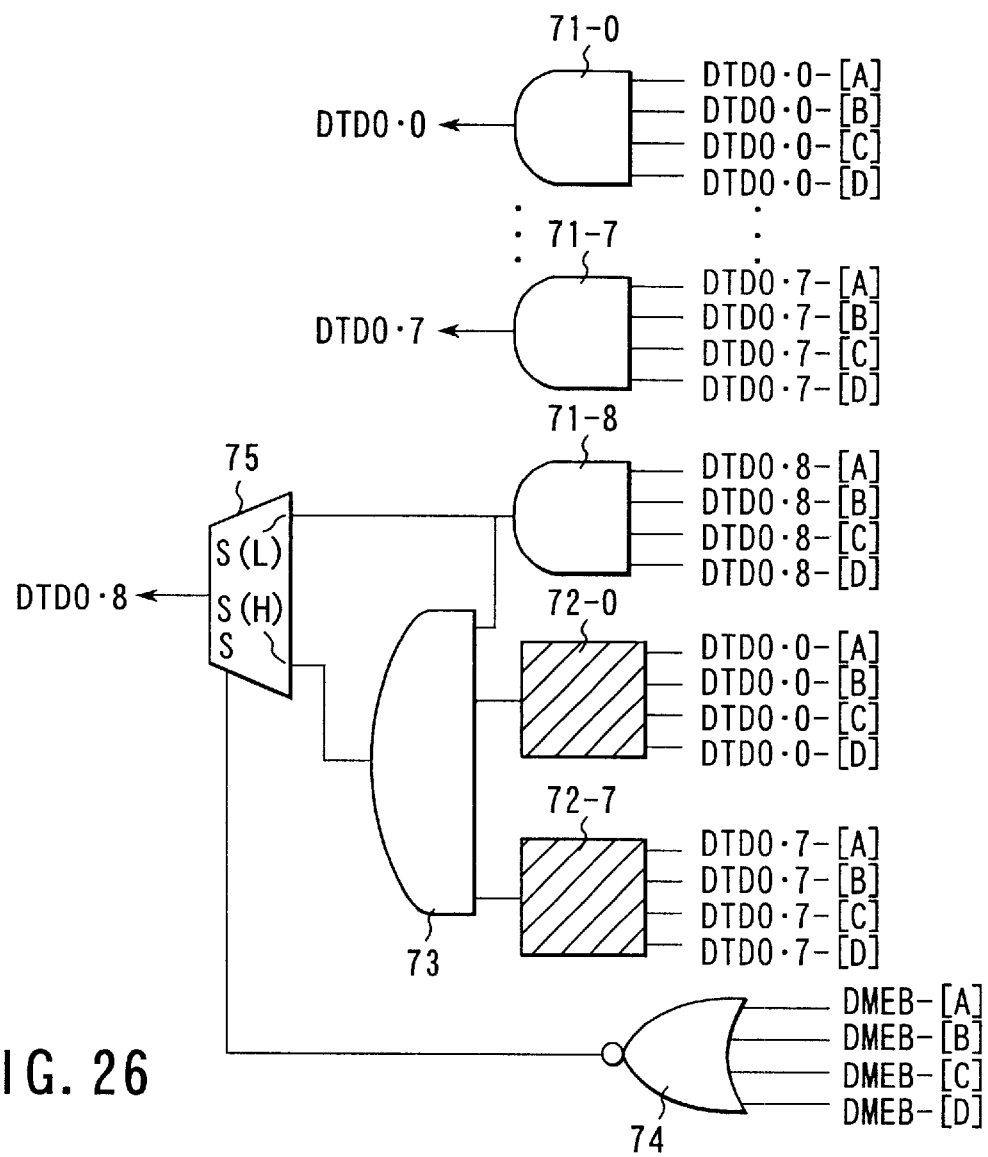
FIG. 26 is a circuit diagram showing another arrangement of the output synthesis circuit in FIG. 23.
Figure 27:
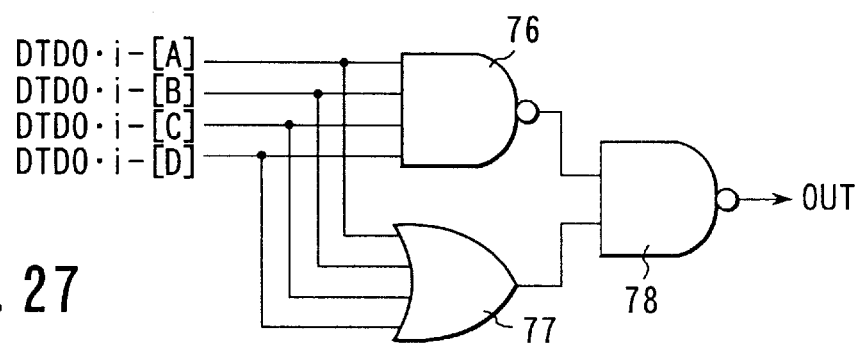
FIG. 27 is a circuit diagram showing an arrangement of a comparator in FIG. 26.

FIG. 26 shows a modification of the output synthesis circuit in FIG. 24. FIG. 27 shows an arrangement of comparators 72-0, . . . , 72-7 in FIG. 26.

The output synthesis circuit of the eighth embodiment can only select the four memory macros in two manners, i.e., one or all of them. This circuit layout can be realized by a simpler circuit than the circuit in FIGS. 24 and 25. This simple circuit can be effectively designed with a small area without any interconnection error.

Reference symbols DTDO·0-[A], . . . , DTDO·7-[A] denote readout data bits output from the memory macro 12A; DTDO·0-[B], . . . , DTDO·7-[B], readout data bits output from the memory macro 12B; DTDO·0-[C], DTDO·7-[C], readout data bits output from the memory macro 12C; and DTDO·0-[D], . . . , DTDO·7-[D], readout data bits output from the memory macro 12D.

The readout data DTDO·i-[A], DTDO·i-[B], DTDO·i-[C], and DTDO·i-[D] from the respective memory macros are input to an AND circuit 71-i which outputs synthesized readout data DTDO·i (i=0, . . . , 7).

The readout data DTDO·i-[A], DTDO·i-[B], DTDO·i-[C], and DTDO·i-[D] from the respective memory macros are also input to the comparator 72-i. An output signal from the comparator 72-i is input to an AND circuit 73. The comparator 72-i outputs "1" when the readout data DTDO·i-[A], DTDO·i-[B], DTDO·i-[C], and DTDO·i-[D] coincide with each other, and "0" when they do not coincide with each other.

DTDO·8-[A], DTDO·8-[B], DTDO·8-[C], and DTDO·8-[D] correspond to PASS/FAIL bits output from the interfaces (FIG. 22) in the memory macros 12A, 12B, 12C, and 12D. An output from the AND circuit 71-8 can become "1" only when the PASS/FAIL bits of the memory macros 12A, 12B, 12C, and 12D is "1" (coincidence).

More specifically, in the eighth embodiment, only when readout data of selected I/O register blocks in a selected memory macro coincide with each other, and readout data of selected memory macros also coincide with each other, an output signal from the AND circuit 73 is "1".

MEn-[A], MEn-[B], MEn-[C], and MEn-[D] are output signals from the macro selection circuits (FIG. 11) of the memory macros 12A, 12B, 12C, and 12D. MEn-[A], MEn-[B], MEn-[C], and MEn-[D] are "0" when the memory macros are selected, and "1" when no memory macros are selected.

A multiplexer 75 connects a terminal S(H) to the output terminal when a switch input S is "1", and a terminal S(L) to the output terminal when the switch input S is "0". When all the memory macros are selected, i.e., the switch input S is "1", an output signal from the AND circuit 73 is output as the PASS/FAIL bit DTDO·8; when one memory macro is selected, i.e., the switch input S is "0", an output signal from the AND circuit 71-8 is output as the PASS/FAIL bit DTDO·8.

FIG. 27 shows an arrangement of the comparators 72-0, . . . , 72-7 in FIG. 26.

The output signals DTDO·i-[A], DTDO·i-[B], DTDO·i-[C], and DTDO·i-[D] from the respective memory macros are input to a NAND circuit 76 and OR circuit 77 (i=0, . . . , 7). Output signals from the NAND circuit 76 and OR circuit 77 are input to a NAND circuit 78, and an output signal from the NAND circuit 78 is input to the AND circuit 73 in FIG. 25.

This comparator sets the output signal OUT to "1" when all the output signals DTDO·i-[A], DTDO·i-[B], DTDO·i-[C], and DTDO·i-[D] from the respective memory macros are the same data "0"or "1", and sets the output signal OUT to "0" when all the output signals DTDO·i-[A], DTDO·i-[B], DTDO·i-[C], and DTDO·i-[D] from the respective memory macros are not the same data.

Figure 28A:
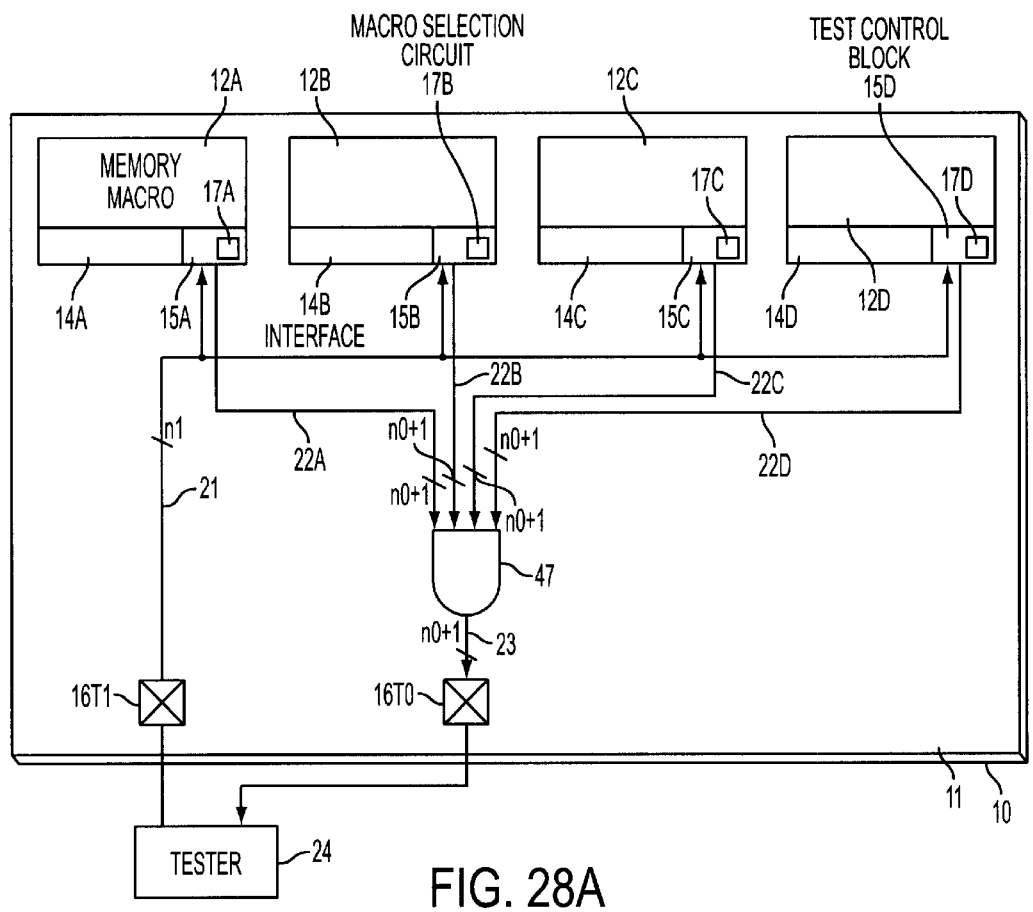
FIGS. 28A and 28B are circuit diagrams, respectively, showing the ninth embodiment of the memory macro test circuit.
Figure 28B:
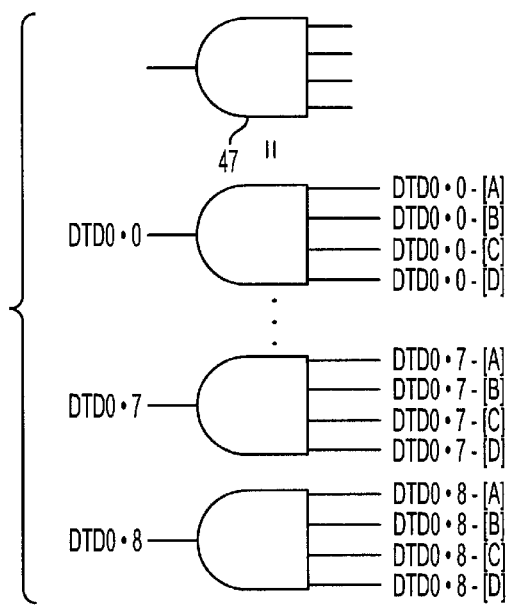

FIGS. 28A and 28B show the ninth embodiment of the memory macro test circuit of the memory-embedded LSI in FIG. 1.

The test circuit of the ninth embodiment is different from the test circuit in FIGS. 3A and 3B in that PASS/FAIL bits DTDO·8-[A], DTDO·8-[B], DTDO·8-[C], and DTDO·8-[D] are output from memory macros 12A, 12B, 12C, and 12D, and synthesized into a PASS/FAIL bit DTDO·8 by an AND circuit.

The four memory macros 12A, 12B, 12C, and 12D are laid out on a semiconductor chip 10. The memory macros 12A, 12B, 12C, and 12D respectively comprise interfaces 14A, 14B, 14C, and 14D for inputting/outputting data, and test control blocks 15A, 15B, 15C, and 15D for controlling a memory macro test.

The test control blocks 15A, 15B, 15C, and 15D comprise macro ID generation circuits for generating macro IDs for identifying the memory macros, and macro selection circuits 17A, 17B, 17C, and 17D for comparing the macro IDs with a macro selection signal (input ID) input externally from the semiconductor chip 10 to the memory macros, and selecting a memory macro.

The macro ID generation circuit may be arranged inside the memory macro (test control block) or outside the memory macro.

Different macro IDs are assigned to the memory macros 12A, 12B, 12C, and 12D. In the ninth embodiment, since the four memory macros are laid out on the semiconductor chip 10, macro IDs "00", "01", "10", and "11" are respectively assigned to the memory macros 12A, 12B, 12C, and 12D.

A logic section 11 has an input signal line 21 capable of transferring, e.g., nI-bit data, first output signal lines 22A, 22B, 22C, and 22D each capable of transferring (nO+1)-bit data, second output signal line 23 capable of transferring (nO+1)-bit data, and AND circuit 47.

One end of the input signal line 21 is connected to a pad 16TI, and the other end is commonly connected to the memory macros 12A, 12B, 12C, and 12D. One end of each of the first output signal lines 22A, 22B, 22C, and 22D is connected to a corresponding one of the memory macros 12A, 12B, 12C, and 12D, and the other end is connected to the AND circuit 47. One end of the second output signal line 23 is connected to the output terminal of the AND circuit 47, and the other end is connected to a pad 16TO.

In general, the pads 16TI and 16TO are used to test the memory macros 12A, 12B, 12C, and 12D and to input/output data or control signal to/from the circuit of the logic section 11 under limitations on the number of pads formed on the pad section.

In the ninth embodiment, nO bits of the (nO+1)-bit data output from the memory macro 12A, 12B, 12C, or 12D correspond to readout data bits DTDO· [A], . . . , DTDO·7 [A], DTDO·0[B], . . . , DTDO·7[B], DTDO·0[C], . . . , DTDO·7[C], or DTDO·0[D], . . . , DTDO·7[D].

One bit of the (nO+1)-bit data output from the memory macro 12A, 12B, 12C, or 12D is newly added in the ninth embodiment, and serves as a PASS/FAIL bit DTDO·8-[A], DTDO·8-[A], DTDO·8-[A], or DTDO·8-[D].

The PASS/FAIL bits DTDO·8-[A], DTDO·8-[B], DTDO·8-[C], and DTDO·8-[D] are based on the comparison results of readout data with an expected value in the memory macros 12A, 12B, 12C, and 12D.

Figure 29:
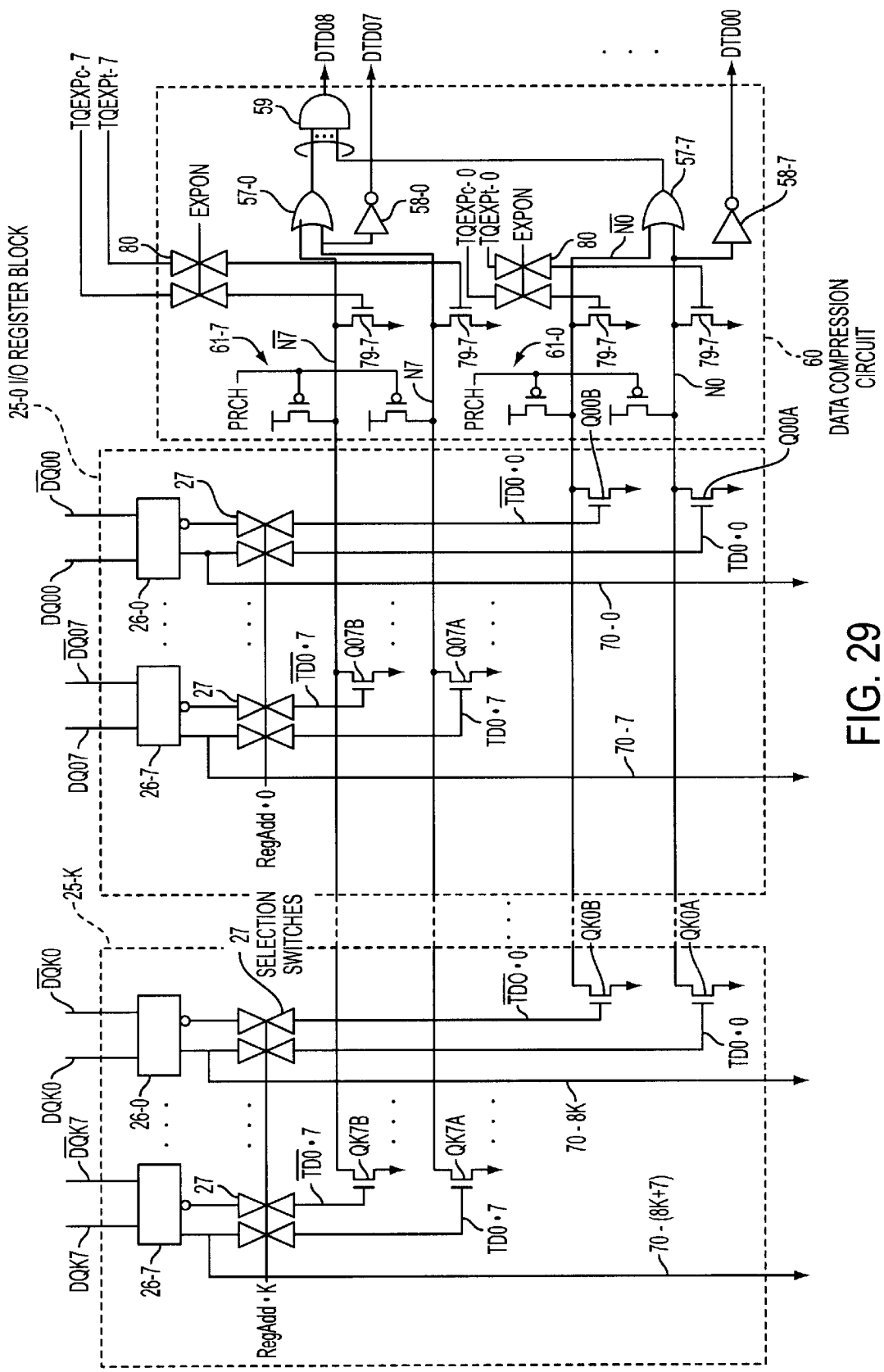
FIG. 29 is a circuit diagram showing a modification of an interface in FIG. 28A.

FIG. 29 shows the interface in FIG. 28A.

The interface of the ninth embodiment is equipped with a circuit capable of comparing readout data of one or more selected I/O register blocks with an expected value in a selected memory macro, and outputting the results.

In the ninth embodiment, an input register, input signal line, and test signal line are omitted for illustrative convenience and descriptive convenience. In practice, these components have a layout as shown in FIG. 7.

The memory macro has (K+1) I/O register blocks 25-0, . . . , 25-K. Each of the I/O register blocks 25-0, . . . , 25-K has, e.g., eight output registers 26-0, . . . , 26-7 and selection switches 27. A terminal of each output register 26-i (i=0, . . . , 7) on the memory macro side is connected to a pair of data lines DQKi and $\overline{DQKi}$ (i=0, . . . , 7).

For example, in the I/O register block 25-K, a terminal of the output register 26-i (i=0, . . . , 7) on the logic section side is connected to a noninverting output terminal and inverting output terminal. The noninverting output terminal is connected to an output signal line 70-i (i=8K, . . . , 8K+7). The noninverting output terminal and inverting output terminal are connected to a data compression circuit 60 via the selection switch 27.

The selection switch 27 is arbitrarily ON/OFF-controlled in units of I/O register blocks by register address signals RegAdd·0, ..., RegAdd·K. For example, in the ninth embodiment, the selection switches 27 in all the I/O register blocks 25-0, ..., 25-K can be turned on.

For example, in the I/O register block 25-0, readout data TDOi and $\overline{\text{TDOi}}$ output from the output register 26-i are input to the gates of n-channel MOS transistors Q0iA and Q0iB (i=0, ..., 7). In the I/O register block 25-K, readout data TDOi and $\overline{\text{TDOi}}$ output from the output register 26-i are input to the gates of n-channel MOS transistors QKiA and QKiB (i=0, ..., 7).

The drains of the MOS transistors Q0iA, ..., QKiA connected to the noninverting output terminals of the output registers 26-i in the I/O register blocks 25-0, ..., 25-K are commonly connected to a node Ni.

The drains of the MOS transistors Q0iB, ..., QKiB connected to the inverting output terminals of the output registers 26-i in the I/O register blocks 25-0, ..., 25-K are commonly connected to a node Ni. The sources of the respective MOS transistors are grounded.

Precharge p-channel MOS transistors 61-0, ..., 61-7 precharge the nodes Ni and $\overline{\text{Ni}}$ to, e.g., a power supply potential ("1") VDD. The gates of the precharge p-channel MOS transistors 61-0, ..., 61-7 receive a precharge signal PRCH. In the ninth embodiment, e.g., the node is precharged in the second half of a clock used for the memory macro, and data is read out in the first half.

If no data is compressed, the register address signals RegAdd·0, ..., RegAdd·K are generated in the test control block, and select one of the K I/O register blocks 25-0, ..., 25-K. A selection switch 27 is turned on in the selected I/O register block, and a selection switch 27 is turned off in the unselected I/O register block.

Then, 8-bit complementary data, TDO·0, $\overline{\text{TDO}}$·0, ..., TDO·7, $\overline{\text{TDO}}$·7 are guided from the selected I/O register block to the data compression circuit 60. The data compression circuit 60 outputs the eight data bits TDO·0, ..., TDO·7 as output signal bits DTDO·0, ..., DTDO·7.

For example, the I/O register block 25-K is selected to turn on and off one and the other one of each of the MOS transistors QkiA and QkiB connected to the noninverting output terminal and inverting output terminal of the output register 26-i in the I/O register block 25-K. Accordingly, one of the nodes Ni and $\overline{\text{Ni}}$ changes to "0", and the other changes to "1".

The ninth embodiment adopts a circuit of comparing data read out from a selected I/O register block with an expected value. The nodes Ni and $\overline{\text{Ni}}$ are respectively connected to n-channel MOS transistors 79-0, ..., 79-7. The sources of the MOS transistors 79-0, ..., 79-7 are grounded. Complementary data TQEXPc-0, ..., TQEXPc-7, TQEXPt-0, ..., TQEXPt-7 for the expected value are respectively input to the gates of the MOS transistors 79-0, ..., 79-7 via switches 80.

When data read out from a selected I/O register block coincides with the expected value, the nodes Ni and $\overline{\text{Ni}}$ are kept unchanged such that one of the nodes Ni and $\overline{\text{Ni}}$ maintains "0" and the other maintains "1". All the output signals from the OR circuits 57-0, ..., 57-7 are "1", and an output signal from the AND circuit 59, i.e., the PASS/FAIL bit DTDO·8 is "1" representing coincidence (PASS).

When data read out from a selected I/O register block does not coincide with the expected value, both the nodes Ni and $\overline{\text{Ni}}$ change to "0". All the output signals from the OR circuits 57-0, ..., 57-7 are not "1", and an output signal from the AND circuit 59, i.e., the PASS/FAIL bit DTDO·8 is "0" representing noncoincidence (FAIL).

By sequentially selecting the (K+1) I/O register blocks 25-0, ..., 25-K one by one, all the (K+1)×8-bit data can be read out from the memory macro outside the semiconductor chip 10.

If data is compressed, at least two or all of the register address signals RegAdd·0, ..., RegAdd·K change to "1" to select at least two or all of the I/O register blocks 25-0, ..., 25-K. A selection switch 27 is turned on in the selected I/O register block, and a selection switch 27 is turned off in the unselected I/O register block.

In the selected I/O register block, the 8-bit complementary data, TDO·0, $\overline{\text{TDO}}$·0, ..., TDO·7, $\overline{\text{TDO}}$·7 are guided to the data compression circuit 60.

When readout data of selected I/O register blocks coincide with each other, one of the nodes Ni and $\overline{\text{Ni}}$ changes to "0", and the other changes to "1".

When data read out from each selected I/O register block coincides with the expected value, the nodes Ni and $\overline{\text{Ni}}$ are kept unchanged such that one of the nodes Ni and $\overline{\text{Ni}}$ maintains "0" and the other maintains "1". All the output signals from the OR circuits 57-0, ..., 57-7 are "1", and an output signal from the AND circuit 59, i.e., the PASS/FAIL bit DTDO·8 is "1" representing coincidence (PASS).

When data read out from respective selected I/O register blocks do not coincide with each other, or these data coincide with each other but do not coincide with the expected value, both the nodes Ni and $\overline{\text{Ni}}$ change to "0". All the output signals from the OR circuits 57-0, ..., 57-7 are not "1", and an output signal from the AND circuit 59, i.e., the PASS/FAIL bit DTDO·8 is "0" representing noncoincidence (FAIL).

A test method for the memory macro using the interface in FIG. 29 will be explained.

An operation of reading out 8-bit data from one selected I/O register block in a selected memory macro will be described.

For example, when the I/O register block 25-K is selected, the register address signal RedAdd·K changes to "1", and the remaining register address signals RedAdd·0, ..., RedAdd·K-1 change to "0". The output registers 26-0, ..., 26-7 in the I/O register block 25-K output the complementary data TDOi and $\overline{\text{TDOi}}$.

Either one of the two MOS transistors QKiA and QKiB in the I/O register block 25-K is turned on, and the other is turned off. One of the two nodes Ni and $\overline{\text{Ni}}$ changes to "1", and the other changes to "0".

When the noninverting output TDOi of the outputregister 26-i is "1", the node Ni and output signal DTDO·i are "0" and "1", respectively. When the noninverting output TDOi of the output register 26-i is "0", the node Ni and output signal DTDO·i are "1" and "0", respectively. That is, the noninverting output TDOi of the output register 26-i coincides with the output signal DTDO·i.

The switch 80 is turned on to input the complementary data TQEXPt-i and TQEXPc-i to the MOS transistor 79-i. If the nodes Ni and $\overline{\text{Ni}}$ are "1" and "0" for TQEXPt-i="1" and TQEXPc-i="0", the readout data is determined to coincide with the expected value. All the output signals from the OR circuits 57-0, ..., 57-7 are "1", and an output signal from the AND circuit 59, i.e., the PASS/FAIL bit DTDO·8 is "1".

To the contrary, if the nodes Ni and $\overline{\text{Ni}}$ are "0" and "1" for TQEXPt-i="1" and TQEXPc-i="0", the readout data is not determined to coincide with the expected value. All the output signals from the OR circuits 57-0, . . . , 57-7 are not "1", and an output signal from the AND circuit 59, i.e., the PASS/FAIL bit DTDO·8 is "0".

An operation of selecting j I/O register blocks in a selected memory macro, compressing (8×j)-bit data read out from these j blocks into 8-bit data, and reading out the 8-bit data will be described.

The selection switches 27 in the j selected I/O register blocks are turned on. Data of the output registers 26-0, . . . , 26-7 in the j selected I/O register blocks are input to the gates of the n-channel MOS transistors. Assume that at least the I/O register blocks 25-0 and 25-K are selected.

If no defective memory cell exists, the same data is written in the I/O register blocks 25-0 and 25-K, and data read out from the I/O register blocks 25-0 and 25-K should coincide with each other. For example, data "1" and "0" are respectively output to the noninverting output terminals and inverting output terminals of the output registers 26-i in the I/O register blocks 25-0 and 25-K. In this case, both the MOS transistors Q0iA and QKiA are turned on, and both the MOS transistors Q0iB and QKiB are turned off. Further, data "0" and "1", are respectively output to the noninverting output terminals and inverting output terminals of the output registers 26-i in the I/O register blocks 25-0 and 25-K. In this case, both the MOS transistors Q0iA and QKiA are turned off, and both the MOS transistors Q0iB and QKiB are turned on.

In this manner, if no defective memory cell exists, either one of the nodes Ni and $\overline{\text{Ni}}$ changes to "1", and the other changes to "0".

Then, readout data of the I/O register blocks 25-0 and 25-K are compared with the expected value. The complementary data TQEXPt-i and TQEXPc-i are input to the MOS transistor 79-i via the switch 80. When each readout data coincides with the expected value, the nodes Ni and $\overline{\text{Ni}}$ are kept unchanged such that one of the nodes Ni and $\overline{\text{Ni}}$ maintains "1" and the other maintains "0". Therefore, the PASS/FAIL bit DTDO·8 is "1" (PASS).

When each readout data does not coincide with the expected value, both the nodes Ni and $\overline{\text{Ni}}$ change to "0". The PASS/FAIL bit DTDO·8 changes to "0" (FAIL).

If a defective memory cell exists, the same data is written in the I/O register blocks 25-0 and 25-K, but data read out from the I/O register blocks 25-0 and 25-K may not coincide with each other. For example, data "1" and "0" are respectively output to the noninverting output terminal and inverting output terminal of the output register 26-i in the I/O register block 25-0, while data "0" and "1" are respectively output to the noninverting output terminal and inverting output terminal of the output register 26-i in the I/O register block 25-K. In this case, the MOS transistors Q0iA and Q0iB are respectively turned on and off in the I/O register block 25-0, whereas the MOS transistors QKiA and QKiB are respectively turned off and on in the I/O register block 25-K.

Accordingly, if a defective memory cell exists, data read out from the I/O register blocks 25-0 and 25-K may not coincide with each other. At this time, both the nodes Ni and $\overline{\text{Ni}}$ change to "0". The PASS/FAIL bit DTDO·8 changes to "0" (FAIL).

Note that if all the memory cells subjected to a read are defective, data read out from the I/O register blocks 25-0 and 25-K may coincide with each other. Also in this case, readout data does not coincide with the expected value, so the PASS/FAIL bit DTDO·8 is "0".

The ninth embodiment can simultaneously select all the memory macros 12A, 12B, 12C, and 12D in FIG. 28A.

In this case, the PASS/FAIL bits DTDO·8-[A], DTDO·8-[B], DTDO·8-[C], and DTDO·8-[D] output from memory macros 12A, 12B, 12C, and 12D are input to an AND circuit to obtain the PASS/FAIL bit DTDO·8.

The PASS/FAIL bit DTDO·8 is obtained by synthesizing the test results of all the memory macros 12A, 12B, 12C, and 12D. Needless to say, the test results are the comparison results of readout data and expected value.

When the PASS/FAIL bit DTDO·8 is "1", no defective memory cells exist in the memory macros 12A, 12B, 12C, and 12D; when the PASS/FAIL bit DTDO·8 is "0", defective memory cells exist in any of the memory macros 12A, 12B, 12C, and 12D. However, the correspondence between the memory macros 12A, 12B, 12C, and 12D, and defective I/O register blocks is unknown.

The ninth embodiment can also select any one of the memory macros 12A, 12B, 12C, and 12D in FIG. 28A on the basis of the macro ID.

Figure 5B:
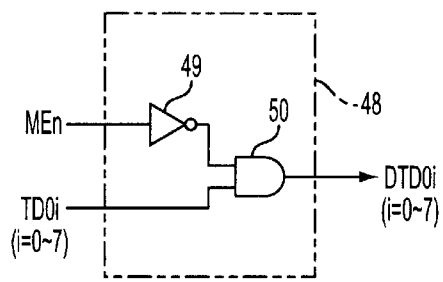

In this case, as shown in the arrangement of FIGS. 4, 5A, and 5B, the ninth embodiment employs an output control circuit of fixing to "1" the readout data bits DTDO·0[A], . . . , DTDO·7[A], DTDO·0[B], . . . , DTDO·7[B], DTDO·0[C], . . . , DTDO·7[C], DTDO·0[D], . . . , DTDO·7[D], and PASS/FAIL bits DTDO·8[A], DTDO·8[B], DTDO·8[C], and DTDO·8[D] output from unselected memory macros.

The memory macro test circuit having the above layout compares readout data with an expected value in a selected memory macro.

For example, in the test circuit in FIG. 28A, all the memory macros 12A, 12B, 12C, and 12D can be selected, and the PASS/FAIL bits DTDO·8[A], DTDO·8[B], DTDO·8[C], and DTDO·8[D] output from the memory macros 12A, 12B, 12C, and 12D can be synthesized by an AND circuit and output as the PASS/FAIL bit DTDO·8. In other words, this test circuit does not require any control signals MEn-[A], MEn-[B], MEn-[C], and MEn-[D] as shown in FIGS. 24 and 26, and can reduce the number of interconnections, interconnection errors, and the design load.

As has been described above, the memory-embedded LSI of these embodiments attains the following effects.

1) In a memory-embedded LSI on which a plurality of memory macros are mounted on one chip, macro ID generation circuits for generating macro IDS used to identify the memory macros in directly testing the memory macros are arranged outside the memory macros (corresponding to, e.g., the arrangement of FIGS. 9 and 10).

In general, the macro ID generation circuits have different layouts for the respective memory macros. By forming these macro ID generation circuits outside the memory macros, test control blocks can use the same layout in all the memory macros. The number of types of circuit blocks used to design memory macros can be reduced to reduce the design load and shorten the design time.

2) By generating macro IDS using a combination of a plurality of fixed potentials, the macro IDS can be generated with a simple layout (corresponding to, e.g., the arrangement of FIG. 13). If the macro ID generation circuits are given an adder function of adding input signals and generating output signals, the macro ID generation circuits in all the memory macros can use the same layout (corresponding to, e.g., the arrangement of FIGS. 14A and 14B). Even if the macro ID generation circuits are arranged inside the test control blocks, the design time can be shortened without increasing the design load or the number of types of circuit blocks used to design memory macros.

3) A memory-embedded LSI on which a plurality of memory macros are mounted on one chip is equipped with a macro output control circuit of fixing an output signal from an unselected memory macro to "0" or "1". In addition, a logic section ORs (OR logic) or ANDs (AND logic) output signals from all the memory macros to output only an output signal from a selected memory macro outside a semiconductor chip (corresponding to, e.g., the arrangement of FIGS. 3A and 3B).

In this case, since an output signal from a selected memory macro can be logically selected, a control signal line necessary for a multiplexer controlled by a macro selection signal can be eliminated to reduce the number of interconnections between the memory macros. Interconnection errors and design load can also be reduced, and the design time can be shortened.

4) In a memory-embedded LSI on which a plurality of memory macros are mounted on one chip, at least two or all of the memory macros are simultaneously selected and tested. In this case, the same data is written in the selected memory macros and read out. The logic section is equipped with an output synthesis circuit of synthesizing output signals from the selected memory macros, and generating a bit representing whether these output signals coincide with each other (corresponding to, e.g., the arrangement of FIG. 18).

The test circuit with a simple layout can simultaneously test all the memory macros, which contributes to a short test time and low manufacturing cost.

5) In a memory macro having an n-bit noninverting output, data is read out in units of s bits ($1 \leq s \leq n$) to directly test the memory macro. In this case, only j (j is a natural number of 2 or more) sets of s-bit data are read out, and the s-bit data are compared between these sets. A bit representing whether these sets of s-bit data coincide with each other is generated and output outside the memory macro (corresponding to, e.g., the arrangement of FIGS. 21 and 22).

In this case, e.g., n-bit data in the memory macro can be tested at once to greatly shorten the test time.

6) An output synthesis circuit capable of simultaneously achieving 4) and 5) is arranged outside the memory macro. Comparison of data in each memory macro and comparison of data between a plurality of memory macros can be done at once to greatly shorten the test time (corresponding to, e.g., the arrangement of FIG. 23).

7) A circuit of comparing readout data with an expected value in each memory macro and outputting the comparison result is adopted. A circuit of synthesizing the comparison results of the memory macros can be constituted by a simple circuit such as an AND logic. The number of interconnections, interconnection errors, and design load can be reduced (corresponding to, e.g., the arrangement of FIGS. 28A and 28B).

The present invention can be applied to products (e.g., memory-embedded ASIC and memory-embedded MPU) completed by forming a plurality of functions including a semiconductor memory function on one chip. In addition, the present invention can also be applied to products (e.g., ASSM (Application Specific Standard Memory)) completed by forming only a semiconductor memory function on one chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory-embedded LSI comprising:

a plurality of memory macros which are laid out in one chip and have a semiconductor memory function;

macro ID generation circuits aranged outside said plurality of memory macros in the one chip to generate macro IDs for identifying said plurality of memory macros; and an output selection circuit arranged outside said plurality of memory macros in the one chip to electrically connect one of said plurality of memory macros to an output pad, wherein data having n0-bits is transferred from one of said plurality of memory macros to said output pad in a test mode;

wherein n0 is a natural number of at least 2.

2. A memory-embedded LSI according to claim 1, further comprising macro selection circuits each selecting one of said plurality of memory macros on the basis of a macro ID.

3. A memory-embedded LSI according to claim 2, wherein said macro selection circuits are arranged in said memory macros and have the same layout between said memory macros.

4. A memory-embedded LSI according to claim 2, wherein said macro selection circuits are arranged outside said plurality of memory macros together with said macro ID generation circuits.

5. A memory-embedded LSI according to claim 1, wherein said macro ID generation circuits generate the macro IDs using a combination of a plurality of fixed potentials.

6. A memory-embedded LSI comprising:

a plurality of memory macros which are laid out in one chip and have a semiconductor memory function;

a plurality of adders which are arranged in correspondence with said plurality of memory macros and have a function of adding input signals and generating output signals; and an output selection circuit arranged outside said plurality of memory macros in the one chip to electrically connect one of said plurality of memory macros to an output pad, wherein said plurality of adders are series-connected to each other, and input or output signals of said plurality of adders are used as macro IDs for identifying said plurality of memory macros, wherein data having n0-bits is transferred from one of said plurality of memory macros to said output pad in a test mode;

wherein n0 is a natural number of at least 2.

7. A memory-embedded LSI according to claim 6, wherein said plurality of adders are arranged in corresponding memory macros and have the same layout between said memory macros.

8. A memory-embedded LSI comprising:

a plurality of memory macros which are laid out in one chip and have a semiconductor memory function;

macro selection circuits each selecting one of said plurality of memory macros;

a plurality of macro output control circuits which are arranged in correspondence with said plurality of memory macros and have a function of setting an output signal from an unselected memory macro to a fixed potential; and a logic circuit arranged outside said plurality of memory macros in the one chip to guide only an output signal from a selected memory macro to an output pad by performing logic processing for output signals from said plurality of memory macros, wherein the output signal of said selected memory macro is comprised of n0-bits, wherein n0 is a natural number of at least 2.

9. A memory-embedded LSI according to claim 8, wherein said plurality of macro output control circuits are arranged in corresponding memory macros and have the same layout between said memory macros.

10. A memory-embedded LSI according to claim 8, wherein said logic circuit executes OR logic or AND logic of the output signals from said plurality of memory macros.

11. A memory-embedded LSI comprising:

a plurality of memory macros which are laid out in one chip and have a semiconductor memory function;

macro selection circuits each having a function of selecting at least two of said plurality of memory macros; and a logic circuit arranged outside said plurality of memory macros in one chip to generate a PASS/FAIL bit representing whether output signals from the at least two selected memory macros coincide with each other by performing logic processing for the output signals from the at least two selected memory macros, wherein when the output signals from the at least two selected memory macros coincide with each other, said logic circuit outputs the output signals from the at least two selected memory macros to an output pad, wherein the output signals from the at least two selected memory macros are comprised of n0-bits, wherein n0 is a natural number of at least 2.

12. A memory-embedded LSI according to claim 11, wherein each memory macro comprises:

a first circuit reading out j sets of s-bit data from memory cells to compare the s-bit data between the sets; and a second circuit outputting a PASS/FAIL bit representing whether the s-bit data of the sets coincide with each other, wherein j is a natural number of at least 2, wherein n is a natural number of at least 2, wherein s is a natural number of at least 1 and no greater than n.

13. A memory macro outputting n-bit data, comprising:

a first circuit reading out j sets of s-bit data from memory cells to compare the s-bit data between the sets;

a second circuit outputting a PASS/FAIL bit representing whether the s-bit data of the sets coincide with each other; and a third circuit, when the s-bit data of the sets coincide with each other, outputting the s-bit data of the sets outside said memory macro, wherein j is a natural number of at least 2, wherein n is a natural number of at least 2, wherein s is a natural number of at least 1 and no greater than n.

14. A test method for testing a plurality of memory macros in one chip, comprising the steps of:

simultaneously selecting the plurality of memory macros to write the same data in the memory macros;

outputting a PASS/FAIL bit representing whether output signals from the memory macros coincide with each other;

outputting, when the output signals from the memory macros coincide with each other, the output signals from the memory macros; and determining nondefectives/defectives of the plurality of memory macros on the basis of the PASS/FAIL bit and the output signals from the memory macros, wherein the output signals from the memory macros are comprised of n0-bits, wherein n0 is a natural number of at least 2.

15. The test method of claim 14, wherein the step of determining nondefectives/defectives occurs outside of the one chip.

16. A test method for testing a memory macro outputting n-bit data, comprising the steps of:

assuming j blocks in units of s bits in the memory macro to write the same data in the blocks;

outputting a PASS/FAIL bit representing whether s-bit output signals from the blocks coincide with each other;

outputting, when the s-bit output signals from the blocks coincide with each other, the s-bit output signals from the blocks; and determining nondefectives/defectives of the memory macro on the basis of the PASS/FAIL bit and the s-bit output signals from the blocks, wherein j is a natural number of at least 2, wherein n is a natural number of at least 2, wherein s is a natural number of at least 1 and no greater than n.

17. The test method of claim 16, wherein the step of determining nondefectives/defectives occurs outside of a chip comprising the memory macro.

18. A test method for testing a plurality of memory macros, each outputting n-bit data, comprising the steps of:

assuming j blocks in units of s bits in each memory macro to write the same data in the blocks;

outputting a PASS/FAIL bit representing whether s-bit output signals from the blocks coincide with each other and whether output signals from the memory macros coincide with each other;

when the s-bit output signals from the blocks coincide with each other and the output signals from the memory macros coincide with each other, outputting the output signals from the memory macros; and determining nondefectives/defectives of the plurality of memory macros on the basis of the PASS/FAIL bit and the output signals from the memory macros wherein j is a natural number of at least 2, wherein n is a natural number of at least 2, wherein s is a natural number of at least 1 and no greater than n.

19. The test method of claim 18, wherein the step of determining nondefectives/defectives occurs outside of a chip comprising the plurality of memory macros.

20. A test method for testing a memory macro outputting n-bit data, comprising the steps of:
- reading out s-bit data of the memory macro from memory cells;
- comparing the s-bit data with an expected value for determining whether the s-bit data is correct in the memory macro;
- generating a PASS/FAIL bit representing whether the s-bit data coincides with the expected value; and
- determining nondefectives/defectives of the memory macro on the basis of the PASS/FAIL bit,
- wherein n is a natural number of at least 2,
- wherein s is a natural number of at least 1 and no greater than n.

21. The test method of claim 20, wherein the step of determining nondefectives/defectives occurs outside a chip comprising the memory macro.

22. A test method for testing a memory macro outputting n-bit data, comprising the steps of:
- assuming j blocks in units of s bits in the memory macro to read out s-bit data of the blocks;
- comparing the s-bit data of the blocks with each other in the memory macro while comparing the s-bit data of each block with an expected value, to generate a PASS/FAIL bit representing whether the s-bit data of the blocks coincide with each other and whether the s-bit data of each block coincides with the expected value; and
- determining nondefectives/defectives of the memory macro on the basis of the PASS/FAIL bit,
- wherein j is a natural number of at least 2,
- wherein n is a natural number of at least 2,
- wherein s is a natural number of at least 1 and no greater than n.

23. The test method of claim 22, wherein the step of determining nondefectives/defectives occurs outside a chip comprising the memory macro.

* * * * *

UNITED STATES PATENT AND TRADEMARK OFFICE
CERTIFICATE OF CORRECTION

PATENT NO. : 6,601,199 B1  
DATED : July 29, 2003  
INVENTOR(S) : Ryo Fukuda et al.

It is certified that error appears in the above-identified patent and that said Letters Patent is hereby corrected as shown below:

Column 38,  
Line 13, "aranged" has been replaced with -- arranged --;  
Line 18, "clectrically" has been replaced with -- electrically --.

Signed and Sealed this

Twenty-fifth Day of November, 2003

JAMES E. ROGAN  
*Director of the United States Patent and Trademark Office*